US008057917B2

(12) United States Patent
Begley et al.

(10) Patent No.: US 8,057,917 B2
(45) Date of Patent: Nov. 15, 2011

(54) PHOSPHORESCENT OLED WITH MIXED ELECTRON TRANSPORT MATERIALS

(75) Inventors: William J. Begley, Webster, NY (US); Tukaram K. Hatwar, Penfield, NY (US); Joseph C. Deaton, Rochester, NY (US); Christopher T. Brown, Rochester, NY (US); Natasha Andrievsky, Webster, NY (US); Marina E. Kondakova, Kendall, NY (US)

(73) Assignee: Global OLED Technology LLC, Herndon, VA (US)

( * ) Notice: Subject to any disclaimer, the term of this patent is extended or adjusted under 35 U.S.C. 154(b) by 0 days.

(21) Appl. No.: 12/121,859

(22) Filed: May 16, 2008

(65) Prior Publication Data

US 2008/0258615 A1 Oct. 23, 2008

Related U.S. Application Data

(63) Continuation of application No. 11/116,096, filed on Apr. 27, 2005, now abandoned.

(51) Int. Cl.
*H01L 51/50* (2006.01)

(52) U.S. Cl. ........ 428/690; 428/917; 313/504; 313/505; 313/506

(58) Field of Classification Search .................. 428/690, 428/917; 313/504, 505, 506
See application file for complete search history.

(56) References Cited

U.S. PATENT DOCUMENTS

| | | | |
|---|---|---|---|
| 6,013,384 A | 1/2000 | Kido et al. | |
| 6,387,546 B1 | 5/2002 | Hamada et al. | |
| 6,396,209 B1 | 5/2002 | Kido et al. | |
| 6,565,996 B2 | 5/2003 | Hatwar et al. | |
| 6,822,257 B2 * | 11/2004 | Lee et al. | 257/40 |
| 2001/0043044 A1 | 11/2001 | Wakimoto et al. | |
| 2001/0052751 A1 | 12/2001 | Wakimoto et al. | |
| 2003/0027016 A1 * | 2/2003 | Ara et al. | 428/690 |
| 2004/0027061 A1 | 2/2004 | Seo et al. | |
| 2004/0126619 A1 | 7/2004 | Nishita | |
| 2004/0185300 A1 * | 9/2004 | Hatwar et al. | 428/690 |
| 2004/0207318 A1 | 10/2004 | Lee et al. | |
| 2007/0026257 A1 | 2/2007 | Begley | |

OTHER PUBLICATIONS

Endo et. al., Organic Electroluminescent Device Having Metal Complexes as Cathode Interface Layer, 2002, Jpn. J. Appl. Phys. vol. 41, pp. L800-L-803.*
Applied Physics Letters, vol. 75, No. 1, Jul. 5, 1999, pp. 4-6, "Very high-efficiency green organic light-emitting devices based on electrophosphorescence", M.A. Baldo, S. Lamansky, P.E. Burrows, M.E. Thompson, S.R. Forest.

(Continued)

*Primary Examiner* — Jennifer Chriss
*Assistant Examiner* — Gregory Clark
(74) *Attorney, Agent, or Firm* — Morgan, Lewis & Bockius LLP

(57) ABSTRACT

An OLED device comprising, in sequence, an anode, a light-emitting layer that comprises a phosphorescent light-emitting organometallic compound, a hole-blocking layer, and a cathode, and between the hole-blocking layer and the cathode, a further layer containing a mixture of a first compound that is a tetracene compound that has the lowest LUMO value of the compounds in the layer, in an amount greater than or equal to 10% and less than 90% and a second compound that is a low voltage electron transport material, exhibiting a higher LUMO value than the first compound in an amount less than or equal to 90% and more than 10%.

17 Claims, 2 Drawing Sheets

OTHER PUBLICATIONS

Jpn J. Appl. Phys. vol. 38 (1999) pp. L1502-L1504, Part 2, No. 12B, Dec. 15, 1999, 1999 Publication Board, Japanese Journal of Applied Physics, "High Quantum Efficiency in Organic Light-Emitting Devices with Iridium-Complex as a Triplet Emissive Center", T. Tsutsui, M. Yang, M. Yahiro, K. Nakamura, T. Watanabe, T. Tsuji, Y. Fukuda, T. Wakimoto and S. Miyaguchi.

Science Direct, Tetrahedron Letters 44 (2003)5747-5750, "Synthesis of t-butylated diphenylanthracene derivatives as blue host materials for OLED applications" Banumathy Balaganesan, Wen-Jian Shen and Chin H. Chen.

* cited by examiner

PHOSPHORESCENT OLED WITH MIXED ELECTRON TRANSPORT MATERIALS

CROSS-REFERENCE TO RELATED APPLICATION

This is a continuation of U.S. application Ser. No. 11/116,096, filed on Apr. 27, 2005, now abandoned, by William J. Begley, et al, the disclosure of which is incorporated by reference. Reference is made to commonly assigned U.S. Ser. Nos. 11/076,821 and 11/077,218 filed on Mar. 10, 2005, by William J. Begley, et al., entitled "Organic Light-Emitting Devices With Mixed Electron Transport Materials" the disclosure of which is incorporated herein by reference.

FIELD OF THE INVENTION

This invention relates to an organic light-emitting diode (OLED) electroluminescent (EL) device having a light-emitting layer including a phosphorescent light-emitting material and a layer between the light-emitting layer and the cathode containing a mixture of at least two compounds.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 µm). Consequently, operating voltages were very high, often greater than 100V.

More recent organic EL devices include an organic EL element consisting of extremely thin layers (e.g. <1.0 µm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (*J. Applied Physics*, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

Many emitting materials that have been described as useful in an OLED device emit light from their excited singlet state by fluorescence. The excited singlet state can be created when excitons formed in an OLED device transfer their energy to the singlet excited state of the dopant. However, only 25% of the excitons created in an EL device are singlet excitons. The remaining excitons are triplet, which cannot readily transfer their energy to the dopant to produce the singlet excited state of a dopant. This results in a large loss in efficiency since 75% of the excitons are not used in the light emission process.

Triplet excitons can transfer their energy to a dopant if it has a triplet excited state that is low enough in energy. If the triplet state of the dopant is emissive it can produce light by phosphorescence. In many cases, singlet excitons can also transfer their energy to the lowest singlet excited state of the same dopant. The singlet excited state can often relax, by an intersystem crossing process, to the emissive triplet excited state. Thus, it is possible, by the proper choice of host and dopant, to collect energy from both the singlet and triplet excitons created in an OLED device and to produce a very efficient phosphorescent emission. The term electrophosphorescence is sometimes used to denote electroluminescence wherein the mechanism of luminescence is phosphorescence.

Another process by which excited states of a dopant can be created is a sequential process in which a hole is trapped by the dopant and subsequently recombines with an electron, or an electron is trapped and subsequently recombines with a hole, in either case producing an excited state of the dopant directly. Singlet and triplet states, and fluorescence, phosphorescence, and intersystem crossing are discussed in J. G. Calvert and J. N. Pitts, Jr., Photochemistry (Wiley, New York, 1966) and further discussed in publications by S. R. Forrest and coworkers such as M. A. Baldo, D. F. O'Brien, M. E. Thompson, and S. R. Forrest, *Phys. Rev. B,* 60, 14422 (1999) and M. A. Baldo, S. R. Forrest, *Phys. Rev. B,* 62, 10956 (2000).

Emission from triplet states is generally very weak for most organic compounds because the transition from the triplet excited state to the singlet ground state is spin-forbidden. However, it is possible for compounds with states possessing a strong spin-orbit coupling interaction to emit strongly from triplet excited states to the singlet ground state (phosphorescence). For example, fac-tris(2-phenyl-pyridinato-N,$C^{2'}$-)Iridium(III) (Ir(ppy)$_3$) emits green light (K. A. King, P. J. Spellane, and R. J. Watts, *J. Am. Chem. Soc.,* 107, 1431 (1985); M. G. Colombo, T. C. Brunold, T. Reidener, H. U. Güdel, M. Fortsch, and H.-B. Bürgi, *Inorg. Chem.,* 33, 545 (1994)). Organic electroluminescent devices having high efficiency have been demonstrated with Ir(ppy)$_3$ as the phosphorescent material and 4,4'-N,N'-dicarbazole-biphenyl (CBP) as the host (M. A. Baldo, S. Lamansky, P. E. Burrows, M. E. Thompson, S. R. Forrest, *Appl. Phys. Lett.,* 75, 4 (1999), T. Tsutsui, M.-J. Yang, M. Yahiro, K. Nakamura, T. Watanabe, T. Tsuji, Y. Fukuda, T. Wakimoto, S. Miyaguchi, *Jpn. J. Appl. Phys.,* 38, L1502 (1999)). Additional disclosures of phosphorescent materials and organic electroluminescent devices employing these materials are found in U.S. Pat. No. 6,303,238 B1, WO 2000/57676, WO 2000/70655, WO 2001/41512 A1, WO 2002/02714 A2, WO 2003/040256 A2, and WO 2004/016711 A1.

Mixed hosts have been used to improve the efficiency, voltage and operational stability of phosphorescent OLED devices. H. Aziz et al. in U.S. Pat. No. 6,392,250 B1, US 2003/0104242 A1 and US 2003/0134146 A1 disclose organic electroluminescent devices having an emissive layer containing the phosphorescent 2,3,7,8,12,13,17,18-octaethyl-21H, 23H-porhine Platinum(II) (PtOEP) dopant and an about equal weight percent of both NPB and Alq (tris(8-quinolinolato) aluminum (III)) as host materials. R. Kwong et al. in US 2002/0074935 A1 also disclose devices with an emissive layer containing the PtOEP or bis(benzothienyl-pyridinato-NAC)Iridium(III) (acetylacetonate) as a dopant and equal proportions of NPB and Alq as host materials. In US 2004/0155238 a light-emitting layer of the OLED device contains a wide band gap inert host matrix in combination with a charge carrying material and a phosphorescent emitter. The charge carrying compound can transport holes or electrons, and it is selected so that charge carrying material and phosphorescent emitter transport charges of opposite polarity. However, in this case, blue OLED devices employing these disclosed materials require use of substantial amounts of the phosphorescent emitters and still do not solve the high voltage problem.

M. Furugori et al. in US 2003/0141809 disclose phosphorescent devices where a host material is mixed with another hole- or electron-transporting material in the light-emitting layer. The document describes that devices utilizing plural host compounds show higher current and higher efficiencies at a given voltage; however, reported luminance data are quite moderate. Efficient single-layer-solution processed phosphorescent OLED devices based on fac-tris(2-phenylpyridine) Iridium cored dendrimer are described in T. Anthopoulos et al., *Appl. Phys. Lett.*, 82, 4824 (2003). T. Igarashi et al. in WO 2004/062324 A1 disclose phosphorescent devices with the light-emitting layer containing at least one electron-transporting compound, at least one hole-transporting compound and a phosphorescent dopant. Various materials were tested as co-hosts for the blue and green emitters, and high efficiency devices are reported. However, luminous and power efficiencies of the disclosed OLEDs can be improved much further.

High emission efficiency in phosphorescent OLED devices with a neat host is usually obtained by incorporating a hole-blocking material between the light-emitting layer and the cathode in order to limit the migration of holes and confine electron-hole recombination and the resulting excitons to the light-emitting layer (for example, see U.S. Pat. No. 6,097,147).

In addition to a hole-blocking layer, a phosphorescent OLED device employing a neat host and a phosphorescent material may include at least one hole-transporting layer with suitable triplet energy levels, placed adjacent to the light-emitting layer on the anode side, to help confine the electron-hole recombination events to the light-emitting layer. This feature can further improve the efficiency of the device. Examples of hole-transporting materials whose energy levels make them suitable for use with many phosphorescent materials include 4,4',4"-tris(N-3-methylphenyl-N-phenylamino)triphenylamine (MTDATA; see JP2003092186A), bis[4-(N,N-diethylamino)-2-methylphenyl](4-methylphenyl)methane (MPMP; see WO02/02714 and WO03/040257), N,N-bis[2,5-dimethyl-4-[(3-methylphenyl)phenylamino]phenyl]-2,5-dimethyl-N'-(3-methylphenyl)-N'-phenyl-1,4-benzenediamine (see JP2004 139819 A and US 2004/018910 A1). However, use of these materials alone does not give the optimum performance possible in an electroluminescent device.

M. Thompson et al., in US 2004/0048101, disclose phosphorescent blue and white OLED devices comprising an electron blocking layer and the light-emitting layer with a neat host and a phosphorescent emitter. By inserting an electron-blocking layer between the hole-transporting and light-emitting layers electron leakage can be eliminated and, hence, luminous efficiency is increased. Fac-tris(1-phenylpyrazolato,N,$C^{2'}$)Iridium (III) (Irppz) and Iridium(III)bis(1-phenylpyrazolato,N,$C^{2'}$)(2,2,6,6-tetramethyl-3,5-heptanedionato-O,O)(ppz$_2$Ir(dpm)) have been disclosed as suitable electron blocking materials.

A useful class of electron-transporting materials is that derived from metal chelated oxinoid compounds including chelates of oxine itself, also commonly referred to as 8-quinolinol or 8-hydroxyquinoline. Tris(8-quinolinolato)aluminum (III), also known as Alq or Alq$_3$, and other metal and non-metal oxine chelates are well known in the art as electron-transporting materials.

Tang et al., in U.S. Pat. No. 4,769,292 and VanSlyke et al., in U.S. Pat. No. 4,539,507 lower the drive voltage of the EL devices by teaching the use of Alq as an electron transport material in the luminescent layer or luminescent zone.

Baldo et al., in U.S. Pat. No. 6,097,147 and Hung et al, in U.S. Pat. No. 6,172,459 teach the use of an organic electron-transporting layer adjacent to the cathode so that when electrons are injected from the cathode into the electron-transporting layer, the electrons traverse both the electron-transporting layer and the light-emitting layer.

The use of a mixed layer of a hole-transporting material and an electron-transporting material in the light-emitting layer is well known. For example, see US 2004/0229081; U.S. Pat. No. 6,759,146, U.S. Pat. No. 6,759,146; U.S. Pat. No. 6,753,098; and U.S. Pat. No. 6,713,192 and references cited therein. Kwong and co-workers, US 2002/0074935, describe a mixed layer comprising an organic small molecule hole-transporting material, an organic small molecule electron-transporting material and a phosphorescent dopant.

Tamano et al., in U.S. Pat. No. 6,150,042 teaches use of hole-injecting materials in an organic EL device. Examples of electron-transporting materials useful in the device are given and included therein are mixtures of electron-transporting materials. There is no indication of how to select the electron-transporting materials in terms of Lowest Unoccupied Molecular Orbital levels (LUMOs) and no reference to low drive voltage with the devices.

Seo et al., in US2002/0086180A1 teaches the use of a 1:1 mixture of Bphen, (also known as 4,7-diphenyl-1,10-phenanthroline or bathophenanthroline) as an electron-transporting material, and Alq as an electron injection material, to form an electron-transporting mixed layer. However, the Bphen/Alq mix of Seo et al., shows inferior stability. US 2004/0207318 A1 and U.S. Pat. No. 6,396,209 describe an OLED structure including a mixed layer of an electron-transporting organic compound and an organic metal complex compound containing at least one of alkali metal ion, alkali earth metal ion, or rare earth metal ion.

Commonly owned U.S. Ser. Nos. 11/076,821 and 11/077,218 filed on Mar. 10, 2005, describe mixing a first compound with a second compound that is a low voltage electron transport material, to form a layer on the cathode side of the emitting layer in an OLED device, which gives an OLED device that has a drive voltage even lower than that of the device with the low voltage electron transport material. In some cases a metallic material based on a metal having a work function less than 4.2 eV is included in the layer.

However, these devices do not have all desired EL characteristics in terms of high luminance and stability of the components in combination with low drive voltages.

Notwithstanding all these developments, there remains a need to reduce drive voltage of OLED devices, as well as to provide embodiments with other improved features such as operational stability and luminance.

SUMMARY OF THE INVENTION

The invention provides an OLED device comprising, in sequence, an anode, a light-emitting layer that comprises a phosphorescent light-emitting organometallic compound, a hole-blocking layer, and a cathode, and between the hole-blocking layer and the cathode, a further layer containing:

a) a first compound that has the lowest LUMO value of the compounds in the layer, in an amount greater than or equal to 10% by volume and less than 90% by volume of the layer wherein the first compound is a compound represented by Formula V:

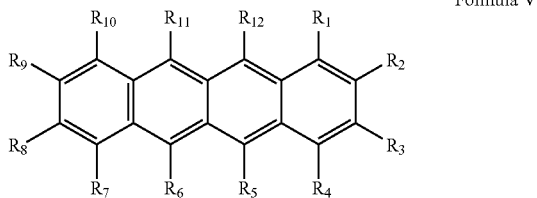

Formula V wherein:

$R_1$, $R_2$, $R_3$, $R_4$, $R_5$, $R_6$, $R_7$, $R_8$, $R_9$, $R_{10}$, $R_{11}$, and $R_{12}$ are independently selected as hydrogen or substituents;

provided that any of the indicated substituents may join to form further fused rings; and b) at least one second compound that is a low voltage electron transport material, exhibiting a higher LUMO value than the first compound, the total amount of said compound(s) being less than or equal to 90% by volume and more than 10% by volume of the layer.

Devices of the invention provide reduced drive voltage of OLED devices, and provide embodiments with other improved features such as operational stability and luminance

DETAILED DESCRIPTION OF THE INVENTION

Figure 1:
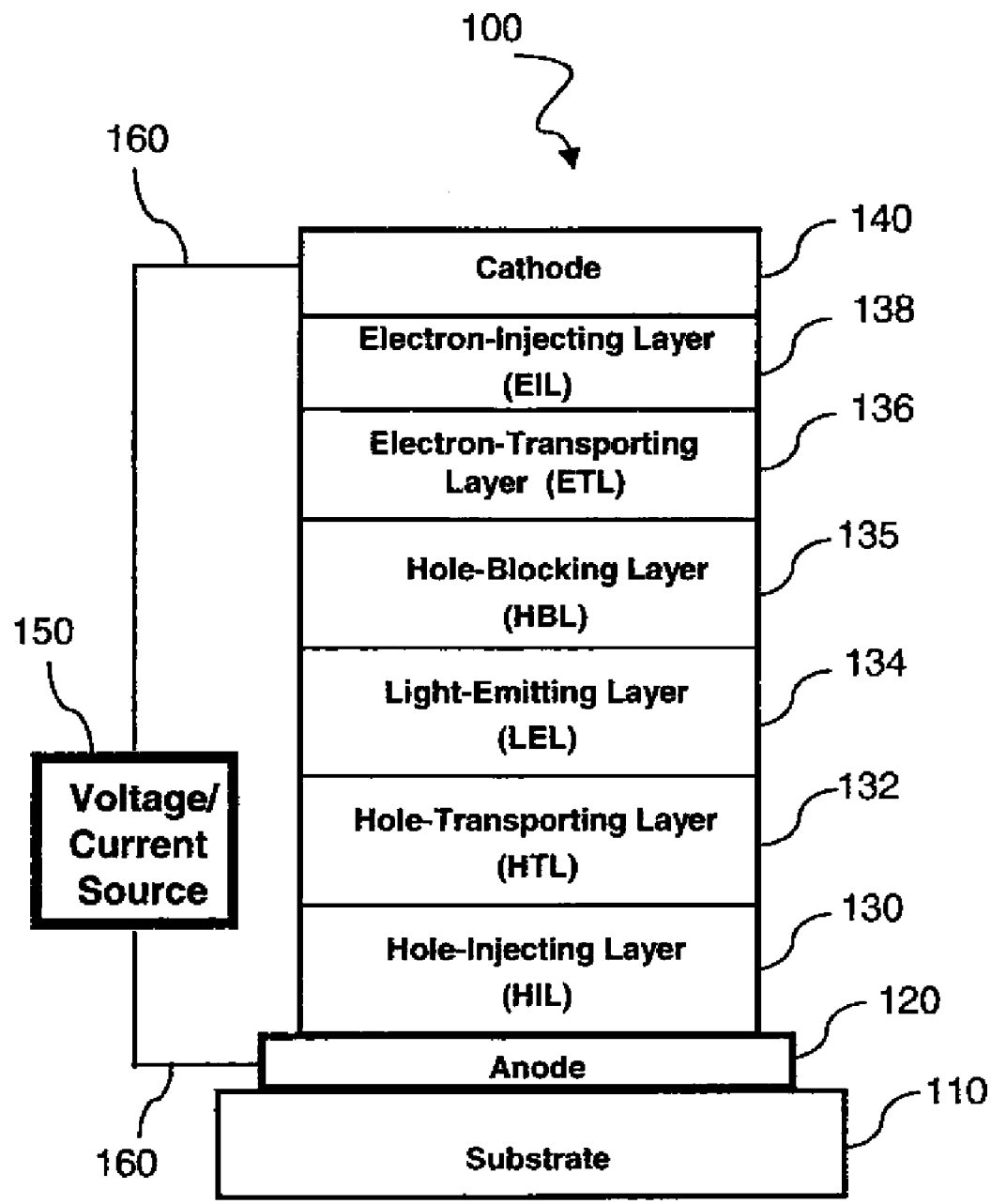
FIG. 1 shows a schematic cross-sectional view of one embodiment of the OLED device of the present invention.

The invention is generally as described above. An OLED device of the invention is a multilayer electroluminescent device comprising a cathode, an anode, hole-injecting layer(s) (if necessary), electron-injecting layer(s) (if necessary), hole-transporting layer(s), electron-transporting layer(s), a light-emitting layer(s) (LEL) and hole-blocking layer(s). At least one light-emitting layer that contains a phosphorescent light-emitting material is present. At least one hole-blocking layer is adjacent to the light-emitting layer. On the cathode side of the hole-blocking layer, is a further layer.

The further layer of the invention contains at least two different compounds, a first compound and at least one second compound. The first compound has the lowest LUMO (Lowest Unoccupied Molecular Orbital) value of the compounds in the layer. The second compound(s) has a higher LUMO value(s) than the first compound and at least one of the second compounds is a low voltage electron transport material.

In one suitable embodiment, the first compound has a LUMO value lower than −2.30 eV, typically lower than −2.50 eV, and desirably lower than −2.70 eV or even lower than −3.00 eV.

In one embodiment, the layer comprises only a first compound and a second compound wherein neither the first or second compounds include an organic metal complex compound containing an alkali metal ion, an alkali earth metal ion, or a rare earth metal ion. In one aspect of the invention, desirably, neither the first or second compounds are tertiary amines since these materials do not transport electrons well.

The amount of the first compound present in the layer is greater than or equal to 10% by volume, but cannot be 100%. In one suitable embodiment the first compound is present in the range of 20-90%, or desirably, in the range of 40-90%, and more typically in the range of 50-80% of the layer by volume. The total amount of the second compound(s), the low voltage electron-transporting material(s), present in the layer is less than or equal to 90% by volume, but cannot be 0%. In other embodiments of the invention, particularly useful levels for the first compound are 20, 40, 50, 60, 75 or 90% with corresponding levels of 80, 60, 50, 40, 25 or 10% respectively for the total amount of the second compound(s).

As used herein, the term "low voltage electron transport material" are those materials that when incorporated alone into the electron-transporting layer result in a drive voltage no more than 50% greater than an analogous device using only Alq in the electron-transporting layer. Thus, a test for a low-voltage material involves fabricating a device using Alq(tris (8-quinolinolato)aluminum (III)) as the electron transport material, illustrated in Example 3. A second device is fabricated replacing Alq with the material to be tested as a low-voltage electron transport material. If the second device has a drive voltage (referred to herein as a test voltage) no more than 50% greater than the device using Alq, than the test material is considered a low-voltage electron transport material. More desirable low-voltage electron transport materials afford a test voltage no more than 40% greater, typically no more than 30% greater, and desirably no more than 25% greater than Alq. Ideally, low-voltage electron transport materials afford a test voltage no greater than 20% or 10% higher than Alq, and preferably equal to or less than Alq, under the test conditions.

Typically, "low voltage electron transport material" are those materials that when incorporated alone into the electron-transporting layer, as described in Example 3, result in drive voltages of 12 volts or less. Low voltage electron transport materials with drive voltages of 11 volts, 10 volts or less are also useful as second compounds of the invention while materials of 9 volts or 8 volts or less are preferred as second compounds. It should be understood that there may be some small experimental variation in the test conditions which may be minimized by comparing the performance of new materials to that of Alq as described previously.

In one embodiment of the invention, the further layer comprises a first compound, a second compound and at least one additional compound. In one suitable embodiment, an additional compound is metallic material based on a metal having a work function less than 4.2 eV. As used herein the term "metallic material" includes both the elemental metal and compounds thereof. In this embodiment, the metal of said further layer is not restricted to a specific one, as long as it is a metal that can reduce at least one of the organic compounds. It can be selected from the alkali metals such as Li, alkali earth metals such as Mg and transition metals including rare earth metals. In particular, the metal having a work function of less than or equal to 4.2 eV can be suitably used as the metal, and typical examples of such dopant metals include Li, Na, K, Be, Mg, Ca, Sr, Ba, Y, La, Sm, Gd, Yb. In one desirable embodiment the metallic material is Li metal. Desirably, the metallic material is present at a level of from 0.1 to 15% by volume of the layer, and typically 0.1% to 10% and more frequently from 1 to 8%.

FIG. 1 shows one embodiment of the invention in which hole-injecting and electron-injecting layers are present. The first compound and the second compound(s) are located in the electron-transporting layer (ETL, 136) and the phosphorescent light-emitting material is located in the light-emitting layer (LEL, 134). A hole-blocking layer (HBL, 135) is between the light-emitting layer and the electron-transporting layer. The figure shows a hole-injecting layer (HIL, 130) and an electron-injecting layer (EIL, 138), but these are optional. The electron-transporting layer in this embodiment is the said further layer containing both the first compound and the second compound(s) and is adjacent to the electron-injecting layer. When there is no electron-injecting layer present, the said further layer is adjacent to the cathode. In other embodiments there may be more than one hole-injecting, electron-injecting and electron-transporting layers. When more than one electron-transporting layers is present, the said further layer of the invention may be adjacent to the cathode while the additional electron-transporting layers are adjacent to the light-emitting layer(s). Additionally, when more than one electron-transporting layers are present, the said further layer of the invention may be adjacent to the hole-blocking layer with the additional electron-transporting layers adjacent to the cathode.

The further layer as described above, can be an emitting or non-emitting layer. Typically, the primary function of the layer is to transport electrons with the result that the OLED device requires a lower voltage for operation than either of the first or second compound alone in the device. When emitting, the electroluminescence from said layer can enhance the overall emission from the device. When non-emitting, either the first or second compound or both should desirably be essentially colorless or non-emitting. In one desirable embodiment, the further layer, as described above, is non-emitting.

In one useful embodiment of the invention the first compound, which has the lowest LUMO in the layer, contains at least two fused rings. At least one of the two fused rings can be a carbocyclic ring, or at least one of the fused rings can be a heterocyclic ring. Suitably, the first compound contains three fused rings, four fused rings, or even more fused rings. At least one of the three fused rings can be a carbocyclic ring, or at least one of the fused rings can be a heterocyclic ring.

In one suitable embodiment, the first compound is a polycyclic hydrocarbon compound and thus does not contain heteroatoms. In another suitable embodiment the first compound is a polycyclic hydrocarbon having at least 3 fused rings and the second compound is an organometallic compound such as tris(8-quinolinolato)aluminum (III) (Alq).

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (N), oxygen (O), sulfur (S), phosphorous (P), silicon (Si), gallium (Ga), boron (B), beryllium (Be), indium (In), aluminum (Al), and other elements found in the periodic table useful in forming ring systems. For the purpose of this invention, also included in the definition of a heterocyclic ring are those rings that include coordinate bonds. The definition of a coordinate bond can be found in *Grant & Hackh's Chemical Dictionary*, page 91. In essence, a coordinate bond is formed when electron rich atoms such as O or N, donate a pair of electrons to electron deficient atoms such as Al or B. One such example is found in tris(8-quinolinolato) aluminum(III), also referred to as Alq, wherein the nitrogen on the quinoline moiety donates its lone pair of electrons to the aluminum atom thus forming the heterocycle and hence providing Alq with a total of 3 fused rings.

Carbocyclic and heterocyclic ring systems useful for the current invention for the first and second compounds are selected from metal and non-metal chelated oxinoids, anthracenes, bipyridyls, butadienes, imidazoles, phenanthrenes, phenanthrolines, styrylarylenes, benzazoles, buckministerfullerene-$C_{60}$ (also known as buckyball or fullerene-$C_{60}$), tetracenes, xanthenes, perylenes, coumarins, rhodamines, quinacridones, dicyanomethylenepyrans, thiopyrans, polymethines, pyrylliums, fluoranthenes, periflanthrenes, silacyclopentadienes or siloles, thiapyrylliums, triazines, carbostyryls, metal and non-metal chelated bis (azinyl)amines, metal and non-metal chelated bis(azinyl) methenes.

In one embodiment, the first and second compounds of the invention can be selected from compounds represented by Formulae I-X.

The first and second compounds can be selected from compounds represented by Formula I:

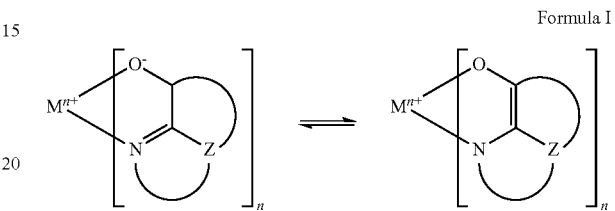

Formula I wherein

M represents a metal or non-metal;

n is an integer of from 1 to 4; and

Z independently in each occurrence represents the atoms completing a nucleus having at least two fused aromatic rings.

The first and second compounds can also be selected from compounds represented by Formula II:

$$(R^S\text{-}Q)_2\text{-M-O-L}$$ Formula II wherein

M is a metal or non-metal;

Q in each occurrence represents a substituted 8-quinolinolato ligand;

$R^S$ represents an 8-quinolinolato ring substituent chosen to block sterically the attachment of more than two substituted 8-quinolinolato ligands to M; and L is a phenyl or aromatic fused ring moiety, which can be substituted with hydrocarbon groups such that L has from 6 to 24 carbon atoms.

Both first and second compounds can be selected from compounds represented by Formula I, or both may be selected from compounds represented by Formula II, with the provisos that the compounds have different LUMO values, that at least one of the second compound is a low voltage electron-transporting material and that the second compound has the highest LUMO value. Additional second compounds can be selected having Formulae I and II.

The first compound of the invention can be selected from chelated bis(azinyl)amines and chelated bis(azinyl)methenes which are represented by Formulae III and IV in which boron and nitrogen form a coordinated bond:

Formula III

-continued

Formula IV

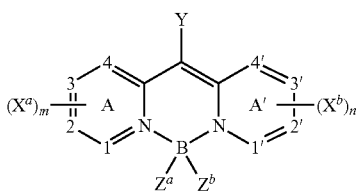

wherein:

A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

$Z^a$ and $Z^b$ are independently selected substituents;

Y is hydrogen or a substituent; and 1, 2, 3, 4, 1', 2', 3', and 4' are independently selected as either carbon or nitrogen atoms.

Additional first compounds can be selected from naphthacene derivatives that are represented by Formulae V:

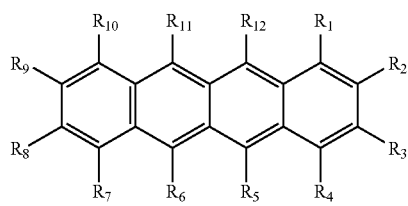

Formula V wherein:

$R_1$, $R_2$, $R_3$, $R_4$, $R_5$, $R_6$, $R_7$, $R_8$, $R_9$, $R_{10}$, $R_{11}$, and $R_{12}$ are independently selected as hydrogen or substituents;

provided that any of the indicated substituents may join to form further fused rings.

A preferred first compound of the invention represented by Formula V are those in which at least one of $R_1$, $R_2$, $R_3$, $R_4$, $R_5$, $R_6$, $R_7$, $R_8$, $R_9$, $R_{10}$, $R_{11}$, and $R_{12}$ are independently selected from alkyl and aryl groups.

In one desirable embodiment, $R_1$, $R_3$, $R_4$, $R_7$, $R_9$, $R_{10}$, represent hydrogen; $R_2$ and $R_8$ represent hydrogen or independently selected alkyl groups; $R_5$, $R_6$, $R_{11}$, and $R_{12}$ represent independently selected aryl groups.

Other first compounds can be selected from anthracene derivatives that are represented by Formulae VI:

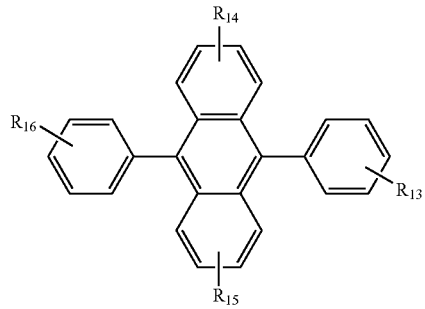

Formula VI wherein:

$R_{13}$, $R_{14}$, $R_{15}$ and $R_{16}$ represent hydrogen or one or more substituents selected from the following groups:

Group 1: hydrogen, alkyl and alkoxy groups typically having from 1 to 24 carbon atoms;

Group 2: a ring group, typically having from 6 to 20 carbon atoms;

Group 3: the atoms necessary to complete a carbocyclic fused ring group such as naphthyl, anthracenyl, pyrenyl, and perylenyl groups, typically having from 6 to 30 carbon atoms;

Group 4: the atoms necessary to complete a heterocyclic fused ring group such as furyl, thienyl, pyridyl, and quinolinyl groups, typically having from 5 to 24 carbon atoms;

Group 5: an alkoxylamino, alkylamino, and arylamino group typically having from 1 to 24 carbon atoms; and Group 6: fluorine, chlorine, bromine and cyano radicals.

More specifically, the first compound of the invention can be selected from compounds represented by the following structures:

A-1

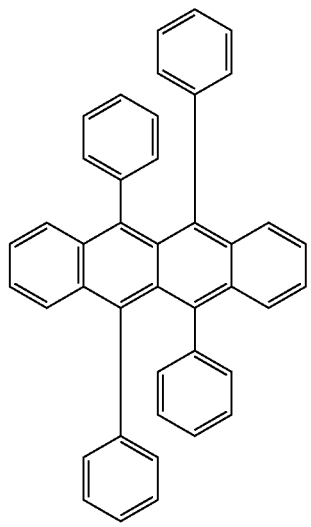

A-2

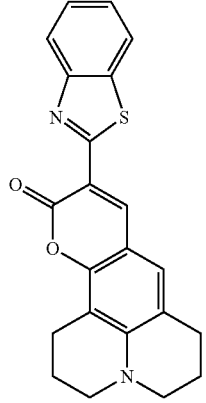

A-3

A-4
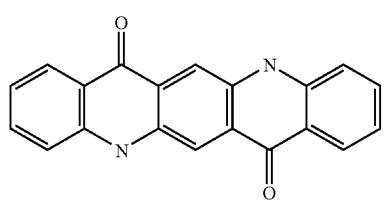
A-5
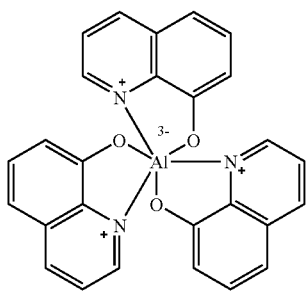
A-6
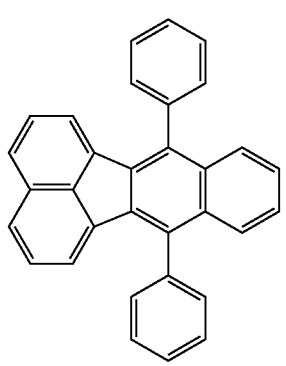
Also included in structures A-1 to A-6 are compounds containing the A-1 through A-6 structural features with substituents suitable to render said structures with the desired properties to function as first compound materials of the invention.
Specifically the first compound of the invention can be selected from the following group;
A-7
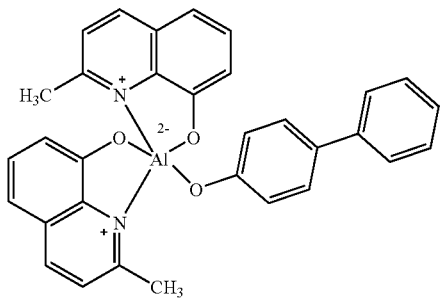
A-8
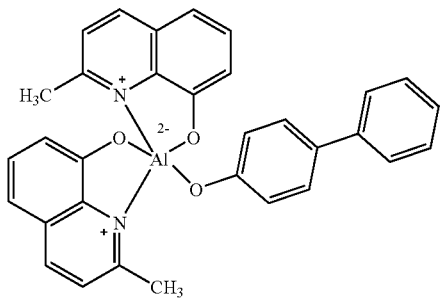
A-9
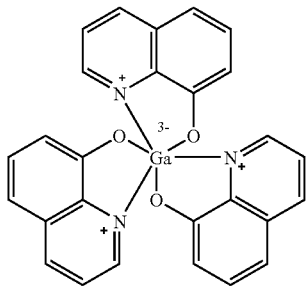

-continued
A-10
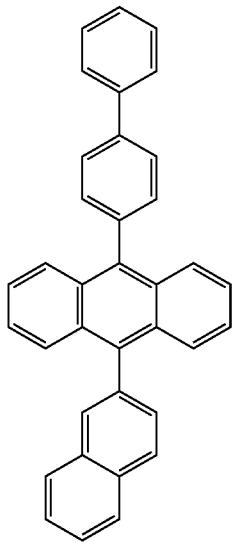
A-11
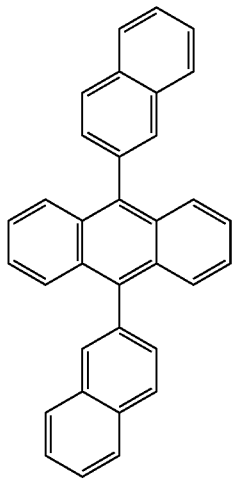
A-12
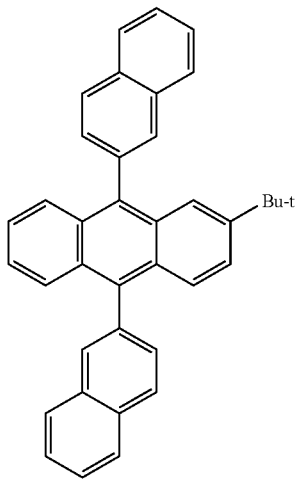

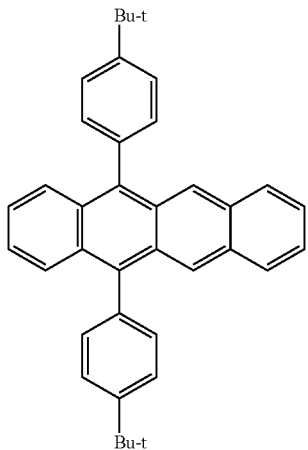
A-13
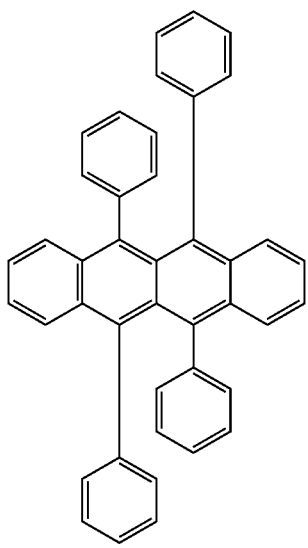
A-14
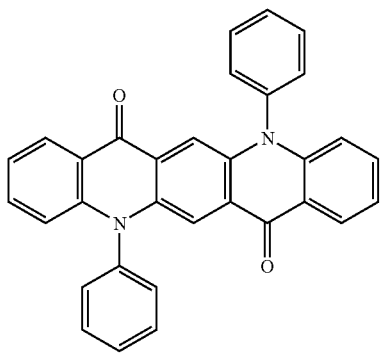
A-15

-continued
A-16
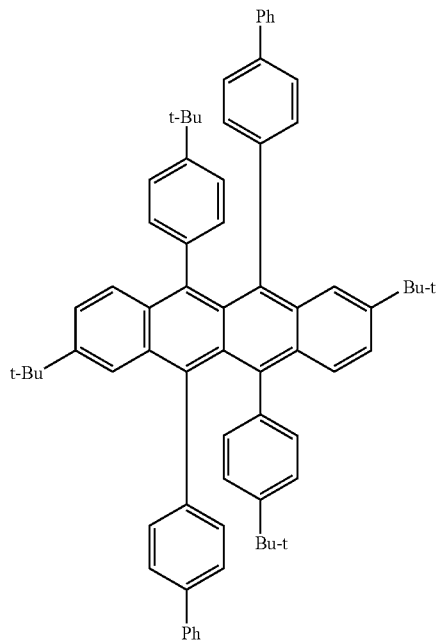
A-17
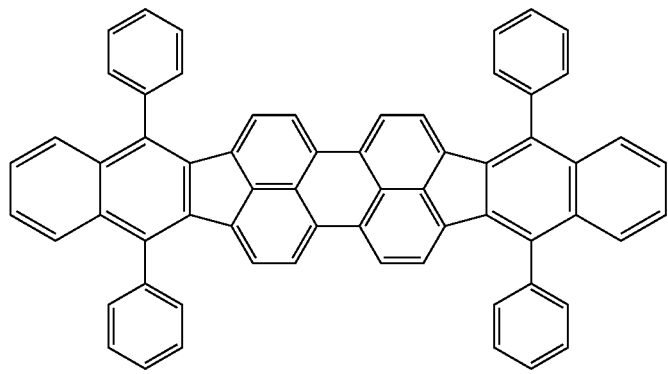
A-18
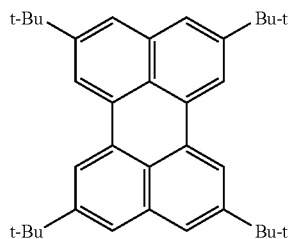
A-19
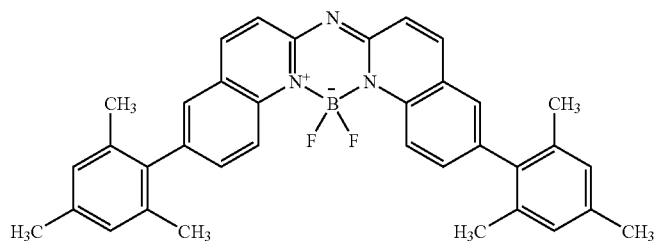

-continued
A-21
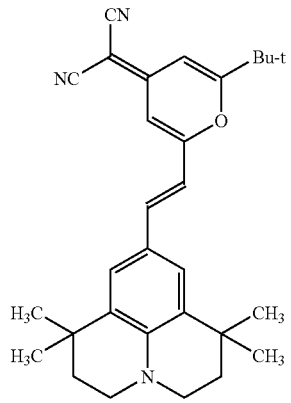
A-21
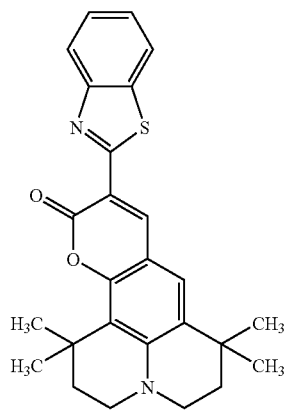
A-22
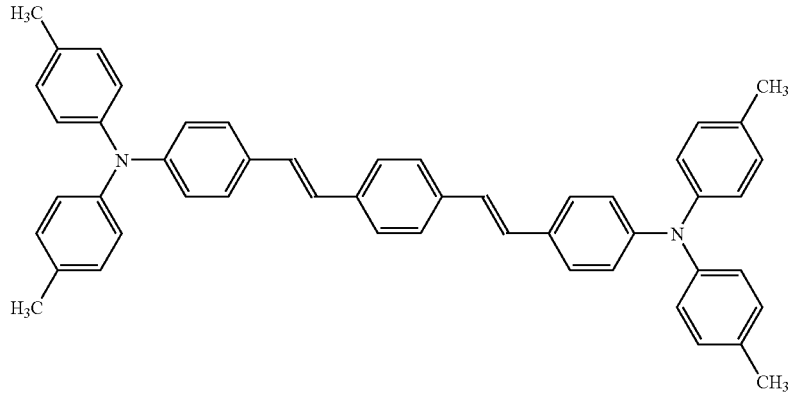
A-23
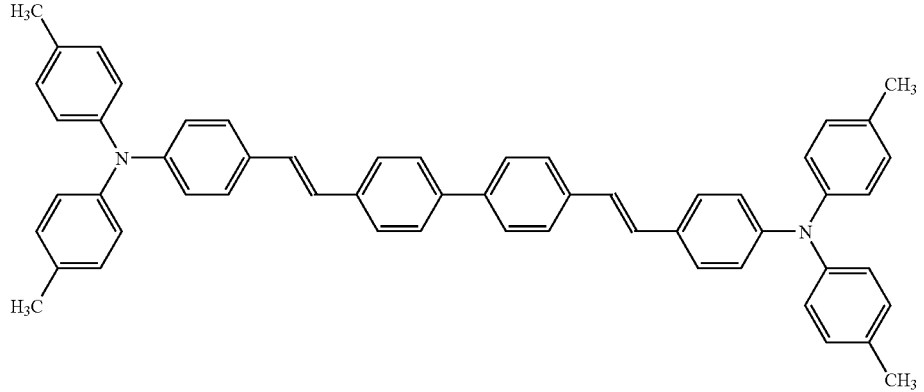

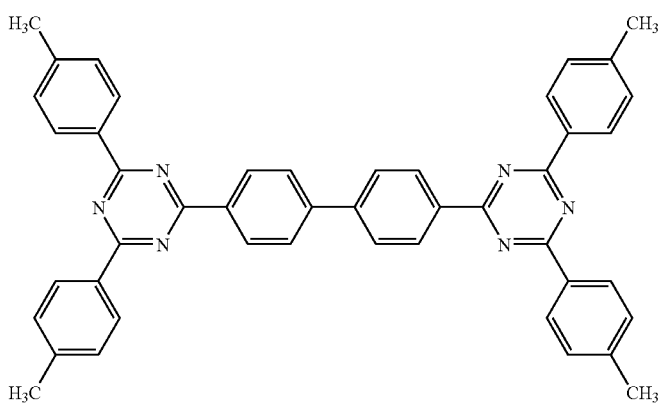

A-24

Second compounds of the invention can be selected from phenanthroline derivatives represented by Formula VII:

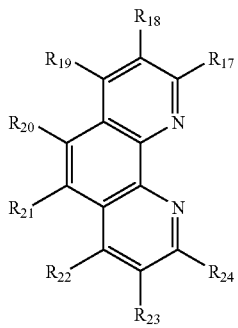

Formula VII wherein
$R_{17}$, $R_{18}$, $R_{19}$, $R_{20}$, $R_{21}$, $R_{22}$, $R_{23}$ and $R_{24}$ are hydrogen or substituents; and
provided that any of the indicated substituents may join to form further fused rings.

Heterocyclic derivatives, represented by Formula VIII form a group of materials from which the second compounds of the invention can be selected:

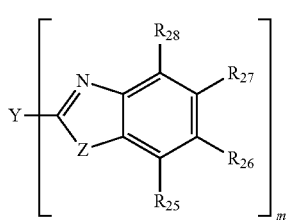

Formula VIII wherein
m is an integer of from 3 to 8;
Z is O, $NR_{29}$, or S;
$R_{25}$, $R_{26}$, $R_{27}$, $R_{28}$ and $R_{29}$ are hydrogen; alkyl of from 1 to 24 carbon atoms; aryl or hetero-atom substituted aryl of from 5 to 20 carbon atoms; or halo; or are the atoms necessary to complete a fused carbocyclic or heterocyclic ring; and
Y is a linkage unit usually comprising an alkyl or aryl group that conjugately or unconjugately connects the multiple benzazoles together.

Additional second compounds of the invention can be selected from silacyclopentadiene or silole derivatives represented by Formula IX:

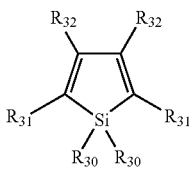

Formula IX wherein
$R_{30}$, $R_{31}$, and $R_{32}$ are hydrogen or substituents or are the atoms necessary to complete a fused carbocyclic or heterocyclic ring.

Other second compounds of the invention can be selected from triazine derivatives represented by Formula X:

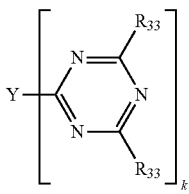

Formula X wherein
k is an integer of from 1 to 4;
$R_{33}$ is hydrogen, substituents or carbocyclic or heterocyclic rings; and
Y is a linkage unit usually comprising an alkyl or aryl group that conjugately or unconjugately connects the multiple triazines together.

Specific examples of second compounds based on Formulae I, II, VI, VII, IX and X are shown in the following structures:

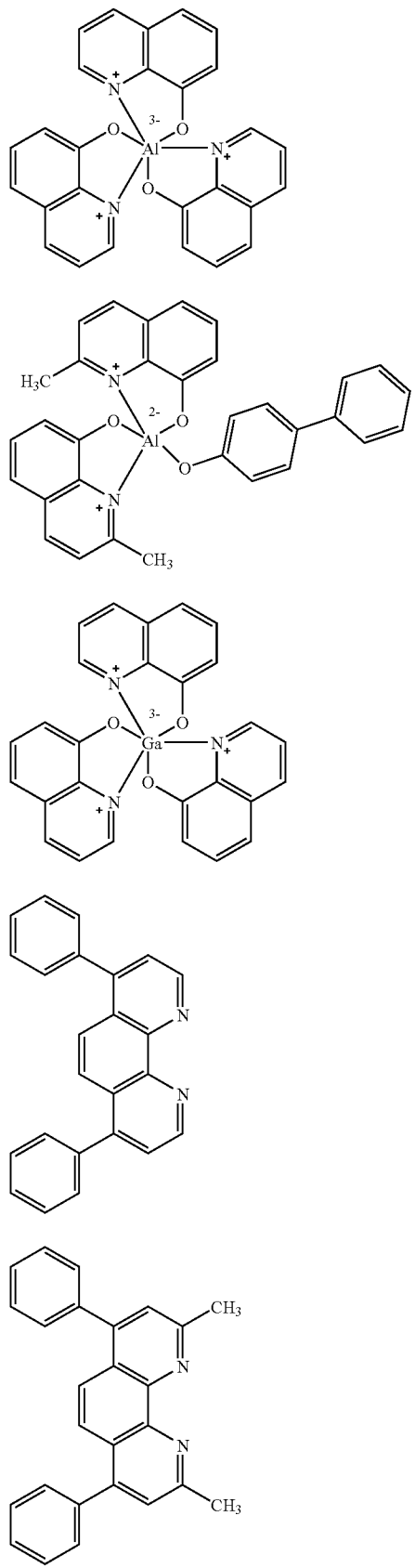
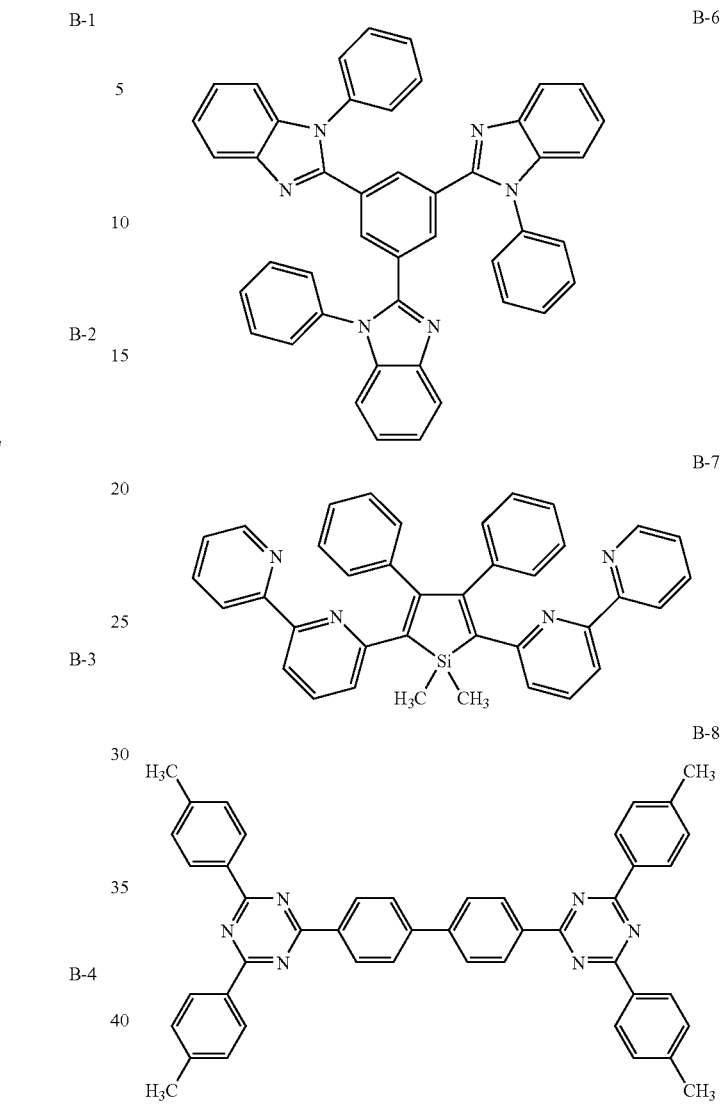

First and second compounds useful in the invention are any of those known in the art that meet the LUMO requirements of the invention and wherein at least one of the second compounds, if more than one is present, is a low voltage electron-transporting material as defined in the invention.

Examples of preferred combinations of the invention are those wherein the first compound is selected from A-7, A-8, A-9, A-13, A-14, A-15A-16, A-18, A-19 and A-24, and the second compounds are selected from B-1, B-2, B-3, B-4, B-5, B-6, B-7 and B-8.

The further layer as described in the invention contains a first compound and a second compound, the first compound having a lower LUMO value than the second compound. In addition, the second compound is a low voltage electron-transporting compound. The combination of both the first and second compounds in the further layer of the invention in the aforementioned ratios, can give devices that have reduced drive voltages even lower when compared to the devices in which either the first or second compound are incorporated alone in said layer.

Following are the chemical names and acronyms associated with many useful compounds for practicing the invention:

A-2, perylene; A-7 or B-1, Alq or Alq$_3$, tris(8-quinolinolato) aluminum (III); A-8 or B-2, BAlq; A-9 or B-3, Gaq or Gaq$_3$, tris(8-quinolinolato)gallium(III); A-10, 9-(2-naphthyl)-10-(4-phenyl)phenylanthracene; A-11, ADN, 9,10-bis(2-naphthyl)-2-phenylanthracene; A-12, tBADN, 2-tert-butyl-9,10-bis(2-naphthyl)-2-phenylanthracene; A-13, tBDPN, 5,12-bis[4-tert-butylphenyl]naphthacene; A-14, rubrene, 5,6,11,12-tetraphenylnaphthacene; A-18, TBP, 2,5,8,11-tetra-tert-butylperylene; B-4, BPhen, 4,7-diphenyl-1,10-phenanthroline; B-5, BCP, 2,9-dimethyl-4,7-diphenyl-1,10-phenanthroline; B-6, TPBI, 2,2',2''-(1,3,5-benzenetriyl)tris[1-phenyl-1H-benzimidazole]; and A-24 or B-8, TRAZ, 2,2'-(1,1'-biphenyl)-4,4'-diylbis(4,6-(p-tolyl)-1,3,5-triazine).

For use herein, the term 8-quinolinolato ligand, is a ligand derived from 8-hydroxyquinoline wherein the nitrogen in the 1-position of quinoline coordinates, by donating its free pair of electrons to a metal or non-metal atom bound to the hydroxyl group in the 8-position, with the metal or non-metal atom accepting the electrons, to form a coordinate bond and a chelated or heterocyclic ring system. $R^S$ is an 8-quinolinolato-ring substituent chosen to block sterically the attachment of more than two substituted 8-quinolinolato ligands to the metal or non-metal atom. Preferred $R^s$ groups are selected from alkyl and aryl groups. L groups are hydrocarbons of from 6 to 24 carbon atoms. Preferred L groups are selected from alkyl, carbocyclic and heterocyclic groups. Y groups are selected from alkyl, carbocyclic or heterocyclic groups. Preferred Y groups are aryl or biphenyl groups. M can be any suitable metal or non-metal found in the periodic table that can be used to form compounds of Formulae I and II. For example, M can be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metals known to be a useful chelating metal can be employed. Also included are boron and beryllium. Additional examples of first and second compounds represented by Formula II can be found in Bryan et al., U.S. Pat. No. 5,141,671, incorporated herein by reference.

According to the present invention, the light-emitting layer of the EL device comprises at least one host and at least one phosphorescent light-emitting material. An efficiency-enhancing hole-blocking layer is desirably placed to adjacent to the light-emitting layer on the cathode side.

Suitable host materials for the phosphorescent light-emitting material should be selected so that transfer of a triplet exciton can occur efficiently from the host material to the phosphorescent emitter but cannot occur efficiently from the phosphorescent emitter to the host material. Therefore, it is highly desirable that the triplet energy of the phosphorescent emitter be lower than the triplet energies of each of the host materials. Generally speaking, a large triplet energy implies a large optical band gap. However, the band gap of the co-host materials should not be chosen so large as to cause an unacceptable barrier to injection of charge carriers into the light-emitting layer and an unacceptable increase in the drive voltage of the OLED device.

Examples of suitable host materials are described in WO 00/70655 A2; 01/39234 A2; 01/93642 A1; 02/074015 A2; 02/15645 A1, US 2002/0117662, and commonly owned U.S. Ser. No. 11/016,108 of Marina E. Kondavova et al., filed Dec. 17, 2004. Suitable hosts include certain aryl amines, triazoles, indoles and carbazole compounds. Examples of suitable materials include, but are not limited to:

1,1-Bis(4-(N,N-di-p-tolylamino)phenyl)cyclohexane (TAPC);
1,1-Bis(4-(N,N-di-p-tolylamino)phenyl)cyclopentane;
4,4'-(9H-fluoren-9-ylidene)bis[N,N-bis(4-methylphenyl)-benzenamine;
1,1-Bis(4-(N,N-di-p-tolylamino)phenyl)-4-phenylcyclohexane;
1,1-Bis(4-(N,N-di-p-tolylamino)phenyl)-4-methylcyclohexane;
1,1-Bis(4-(N,N-di-p-tolylamino)phenyl)-3-phenylpropane;
Bis[4-(N,N-diethylamino)-2-methylphenyl] (4-methylphenyl)methane;
Bis[4-(N,N-diethylamino)-2-methylphenyl](4-methylphenyl)ethane;
4-(4-Diethylaminophenyl)triphenylmethane;
4,4'-Bis(4-diethylaminophenyl)diphenylmethane;
4-(9H-carbazol-9-yl)-N,N-bis[4-(9H-carbazol-9-yl)phenyl]-benzenamine (TCTA);
4-(3-phenyl-9H-carbazol-9-yl)-N,N-bis[4(3-phenyl-9H-carbazol-9-yl)phenyl]-benzenamine;
9,9'-[5'-[4-(9H-carbazol-9-yl)phenyl][1,1':3',1''-terphenyl]-4,4''-diyl]bis-9H-carbazole;
9,9'-(2,2'-dimethyl[1,1'-biphenyl]-4,4'-diyl)bis-9H-carbazole (CDBP);
9,9'-[1,1'-biphenyl]-4,4'-diylbis-9H-carbazole (CBP);
9,9'-(1,3-phenylene)bis-9H-carbazole (mCP);
9,9'-(1,4-phenylene)bis-9H-carbazole;
9,9',9''-(1,3,5-benzenetriyl)tris-9H-carbazole;
9,9'-(1,4-phenylene)bis[N,N,N',N'-tetraphenyl-9H-carbazole-3,6-diamine;
9-[4-(9H-carbazol-9-yl)phenyl]-N,N-diphenyl-9H-carbazol-3-amine;
9,9'-(1,4-phenylene)bis[N,N-diphenyl-9H-carbazol-3-amine;
9-[4-(9H-carbazol-9-yl)phenyl]-N,N,N',N'-tetraphenyl-9H-carbazole-3,6-diamine;
2,9-dimethyl-4,7-diphenyl-phenanthroline (BCP) (see Formula (13)) and 4,7-diphenyl-1,10-phenanthroline (Bphen) (see Formula (14));
3-phenyl-4-(1-naphtyl)-5-phenyl-1,2,4-triazole
2,4,6-tris(diphenylamino)-1,3,5-triazine;
2,4,6-tricarbazolo-1,3,5-triazine;
2,4,6-tris(N-phenyl-2-naphthylamino)-1,3,5-triazine;
2,4,6-tris(N-phenyl-1-naphthylamino)-1,3,5-triazine;
4,4',6,6'-tetraphenyl-2,2'-bi-1,3,5-triazine;
2,4,6-tris([1,1':3',1''-terphenyl]-5'-yl)-1,3,5-triazine.

Examples of especially desirable hosts are 4,4'-N,N'-dicarbazole-biphenyl (CBP), 2,2'-dimethyl-4,4'-N,N'-dicarbazole-biphenyl, 1,3-di(N,N'-dicarbazole)benzene, and poly (N-vinylcarbazole), including their derivatives. In one desirable embodiment, the light-emitting layer that contains the phosphorescent light-emitting material includes more than one host material in order to improve the device's film morphology, electrical properties, light emission efficiency, and lifetime. In a suitable embodiment, the layer contains a first co-host material that has good hole-transporting properties and a second co-host material that has good electron-transporting properties as described U.S. Ser. No. 11/016,108 of Marina E. Kondavova et al., filed Dec. 17, 2004, which is incorporated herein by reference. Desirably, the OLED device also includes at least one exciton-blocking layer placed adjacent to the light-emitting layer on the anode side, to help confine triplet excitons to the light-emitting layer containing the phosphorescent emitter. Suitable exciton-blocking layers are also described in the above Kondakova application. In one embodiment, the selected exciton blocking material or materials have a triplet energy greater or equal to 2.5 eV.

Triplet energy is conveniently measured by any of several means, as discussed for instance in S. L. Murov, I. Carmichael, and G. L. Hug, *Handbook of Photochemistry*, 2nd ed. (Marcel Dekker, New York, 1993).

The triplet state of a compound can also be calculated. The triplet state energy for a molecule is obtained as the difference between the ground state energy (E(gs)) of the molecule and the energy of the lowest triplet state (E(ts)) of the molecule, both given in eV. These energies are obtained using the B3LYP method as implemented in the Gaussian 98 (Gaussian, Inc., Pittsburgh, Pa.) computer program. The basis set for use with the B3LYP method is defined as follows: MIDI! for all atoms for which MIDI! is defined, 6-31G* for all atoms defined in 6-31G* but not in MIDI!, and either the LACV3P or the LANL2DZ basis set and pseudopotential for atoms not defined in MIDI! or 6-31G*, with LACV3P being the preferred method. For any remaining atoms, any published basis set and pseudopotential may be used. MIDI, 6-31G* and LANL2DZ are used as implemented in the Gaussian98 computer code and LACV3P is used as implemented in the Jaguar 4.1 (Schrodinger, Inc., Portland Oreg.) computer code. The energy of each state is computed at the minimum-energy geometry for that state. The difference in energy between the two states is further modified by equation (1) to give the triplet state energy (E(t)):

$$E(t)=0.84*(E(ts)-E(gs))+0.35 \qquad (eq. 1).$$

For polymeric or oligomeric materials, it is sufficient to compute the triplet energy over a monomer or oligomer of sufficient size so that additional units do not substantially change the computed triplet energy.

The calculated values for the triplet state energy of a given compound may typically show some deviation from the experimental values. Thus, the calculations should be used only as a rough guide in the selection of appropriate materials.

According to the present invention, the light-emitting layer of the EL device comprises at least one phosphorescent light-emitting material. The light-emitting phosphorescent material(s) is typically present in an amount of from 1 to 20 by weight % of the light-emitting layer, and conveniently from 2 to 8% by weight of the light-emitting layer. In some embodiments, the phosphorescent complex guest material(s) may be attached to one or more host materials. The host materials may further be polymers. For convenience, the phosphorescent complex material may be referred to herein as a phosphorescent guest material or emitter.

Particularly useful phosphorescent materials are described by Formula (AA) below:

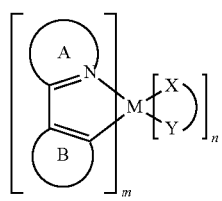

(AA)

wherein:

A is a substituted or unsubstituted heterocyclic ring containing at least one nitrogen atom;

B is a substituted or unsubstituted aromatic or heteroaromatic ring, or ring containing a vinyl carbon bonded to M;

X-Y is an anionic bidentate ligand;

m is an integer from 1 to 3 and n in an integer from 0 to 2 such that m+n=3 for M=Rh or Ir; or m is an integer from 1 to 2 and n in an integer from 0 to 1 such that m+n=2 for M=Pt or Pd.

Compounds according to Formula (AA) may be referred to as C,N- (or C^N-)cyclometallated complexes to indicate that the central metal atom is contained in a cyclic unit formed by bonding the metal atom to carbon and nitrogen atoms of one or more ligands. Examples of heterocyclic ring A in Formula (AA) include substituted or unsubstituted pyridine, quinoline, isoquinoline, pyrimidine, indole, indazole, thiazole, and oxazole rings. Examples of ring B in Formula (AA) include substituted or unsubstituted phenyl, napthyl, thienyl, benzothienyl, furanyl rings. Ring B in Formula (AA) may also be a N-containing ring such as pyridine, with the proviso that the N-containing ring bonds to M through a C atom as shown in Formula (AA) and not the N atom.

In one embodiment, the phosphorescent emitting material comprises an organometallic complex comprising a metal and at least one ligand, wherein the metal is selected from the group consisting of Ir, Rh, Ru, Pt, and Pd. Desirably the metal is Ir.

An example of a tris-C,N-cyclometallated complex according to Formula (AA) with m=3 and n=0 is tris(2-phenyl-pyridinato-N,C²'-)Iridium (III), shown below in stereo-diagrams as facial (fac-) or meridional (mer-) isomers.

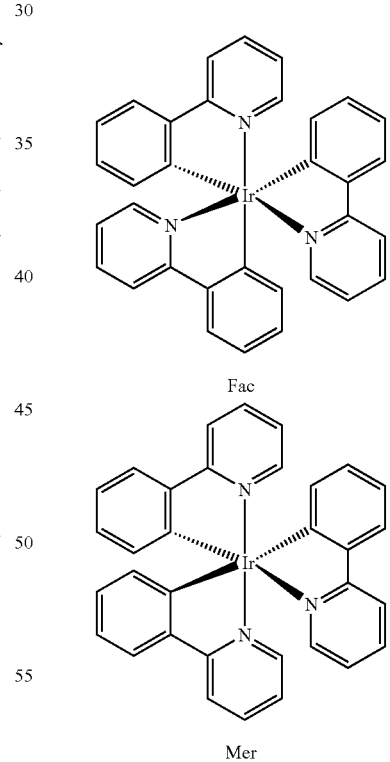

Fac

Mer

Generally, facial isomers are preferred since they are often found to have higher phosphorescent quantum yields than the meridional isomers. Additional examples of tris-C,N-cyclometallated phosphorescent materials according to Formula (AA) are tris(2-(4'-methylphenyl)pyridinato-N,C²)Iridium (III), tris(3-phenylisoquinolinato-N,C²')Iridium(III), tris(2-phenylquinolinato-N,C²')Iridium(III), tris(1-phenylisoquinolinato-N,C$^{2'}$)Iridium(III), tris(1-(4'-methylphenyl)isoquinolinato-N,C$^{2'}$)Iridium(III), tris(2-(4',6'-difluorophenyl)-pyridinato-N,C$^{2'}$)Iridium(III), tris(2-((5'-phenyl)-phenyl)pyridinato-N,C$^{2'}$)Iridium(III), tris(2-(2'-benzothienyl)pyridinato-N,C$^{3'}$)Iridium(III), tris(2-phenyl-3,3'dimethyl)indolato-N,C$^{2'}$)Ir(III), tris(1-phenyl-1H-indazolato-N,C$^{2'}$)Ir(III). In one embodiment, a desirable organometallic complex includes a metal and at least one ligand, wherein the ligand includes a 2-phenylpyridine group, a 1-phenylisoquinoline group, a 3-phenylisoquinoline group, a 1-phenylimidazo[1,2-a]pyridine, a thiazole ring group that is fused with at least one aromatic ring group, or an oxazole ring group that is fused with at least one aromatic ring group.

Tris-C,N-cyclometallated phosphorescent materials also include compounds according to Formula (AA) wherein the monoanionic bidentate ligand X-Y is another C,N-cyclometallating ligand. Examples include bis(1-phenylisoquinolinato-N,C$^{2'}$)(2-phenylpyridinato-N,C$^{2'}$)Iridium(III) and bis(2-phenylpyridinato-N,C$^{2'}$) (1-phenylisoquinolinato-N,C$^{2'}$) Iridium(III). Synthesis of such tris-C,N-cyclometallated complexes containing two different C,N-cyclometallating ligands may be conveniently synthesized by the following steps. First, a bis-C,N-cyclometallated diiridium dihalide complex (or analogous dirhodium complex) is made according to the method of Nonoyama (*Bull. Chem. Soc. Jpn.,* 47, 767 (1974)). Secondly, a zinc complex of the second, dissimilar C,N-cyclometallating ligand is prepared by reaction of a zinc halide with a lithium complex or Grignard reagent of the cyclometallating ligand. Third, the thus formed zinc complex of the second C,N-cyclometallating ligand is reacted with the previously obtained bis-C,N-cyclometallated diiridium dihalide complex to form a tris-C,N-cyclometallated complex containing the two different C,N-cyclometallating ligands. Desirably, the thus obtained tris-C,N-cyclometallated complex containing the two different C,N-cyclometallating ligands may be converted to an isomer wherein the C atoms bonded to the metal (e.g. fr) are all mutually cis by heating in a suitable solvent such as dimethyl sulfoxide.

Suitable phosphorescent materials according to Formula (AA) may in addition to the C,N-cyclometallating ligand(s) also contain monoanionic bidentate ligand(s) X-Y that are not C,N-cyclometallating. Common examples are beta-diketonates such as acetylacetonate, and Schiff bases such as picolinate. Examples of such mixed ligand complexes according to Formula (AA) include bis(2-phenylpyridinato-N,C$^{2'}$)Iridium(III)(acetylacetonate), bis(2-(2'-benzothienyl)pyridinato-N,C$^{3'}$)Iridium(III)(acetylacetonate), and bis(2-(4',6'-difluorophenyl)-pyridinato-N,C$^{2'}$)Iridium(III)(picolinate).

Other important phosphorescent materials according to Formula (AA) include C,N-cyclometallated Pt(II) complexes such as cis-bis(2-phenylpyridinato-N,C$^{2'}$)platinum(II), cis-bis(2-(2'-thienyl)pyridinato-N,C$^{3'}$) platinum(II), cis-bis(2-(2'-thienyl)quinolinato-N,C$^{5'}$) platinum(II), or (2-(4',6'-difluorophenyl)pyridinato-N,C$^{2'}$) platinum (II) (acetylacetonate).

The emission wavelengths (color) of C,N-cyclometallated phosphorescent materials according to Formula (AA) are governed principally by the lowest energy optical transition of the complex and hence by the choice of the C,N-cyclometallating ligand. For example, 2-phenyl-pyridinato-N,C$^{2'}$ complexes are typically green emissive while 1-phenyl-isoquinolinolato-N,C$^{2'}$ complexes are typically red emissive. In the case of complexes having more than one C,N-cyclometallating ligand, the emission will be that of the ligand having the property of longest wavelength emission. Emission wavelengths may be further shifted by the effects of substituent groups on the C,N-cyclometallating ligands. For example, substitution of electron donating groups at appropriate positions on the N-containing ring A or electron accepting groups on the C-containing ring B tend to blue-shift the emission relative to the unsubstituted C,N-cyclometallated ligand complex. Selecting a monodentate anionic ligand X,Y in Formula (AA) having more electron accepting properties also tends to blue-shift the emission of a C,N-cyclometallated ligand complex. Examples of complexes having both monoanionic bidentate ligands possessing electron accepting properties and electron accepting substituent groups on the C-containing ring B include bis(2-(4',6'-difluorophenyl)-pyridinato-N,C$^{2'}$)iridium(III)(picolinate) and bis(2-(4',6'-difluorophenyl)-pyridinato-N,C$^{2'}$)iridium(III)(tetrakis(1-pyrazolyl)borate).

The central metal atom in phosphorescent materials according to Formula (AA) may be Rh or Ir (m+n=3) and Pd or Pt (m+n=2). Preferred metal atoms are Ir and Pt since they tend to give higher phosphorescent quantum efficiencies according to the stronger spin-orbit coupling interactions generally obtained with elements in the third transition series.

In addition to bidentate C,N-cyclometallating complexes represented by Formula AA, many suitable phosphorescent emitters contain multidentate C,N-cyclometallating ligands. Phosphorescent emitters having tridentate ligands suitable for use in the present invention are disclosed in U.S. Pat. No. 6,824,895 B1 and U.S. Ser. No. 10/729,238 (pending) and references therein, incorporated in their entirety herein by reference. Phosphorescent emitters having tetradentate ligands suitable for use in the present invention are described by the following:

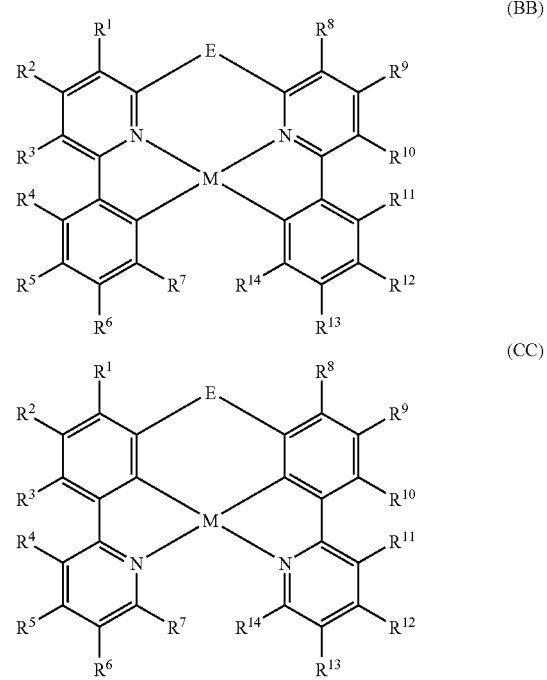

wherein:
M is Pt or Pd;
R$^1$-R$^7$ represent hydrogen or independently selected substituents, provided that R$^1$ and R$^2$, R$^2$ and R$^3$, R$^3$ and R$^4$, R$^4$ and R$^5$, R$^5$ and R$^6$, as well as R$^6$ and $R^7$ may join to form a ring group;

$R^8$-$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$, may join to form a ring group;

E represents a bridging group selected from the following:

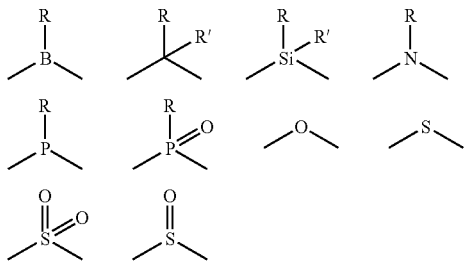

wherein R and R' represent hydrogen or independently selected substituents;

provided R and R' may combine to form a ring group.

In one desirable embodiment, the tetradentate C,N-cyclometallated phosphorescent emitter suitable for use in the present invention is represented by the following Formula:

(DD)

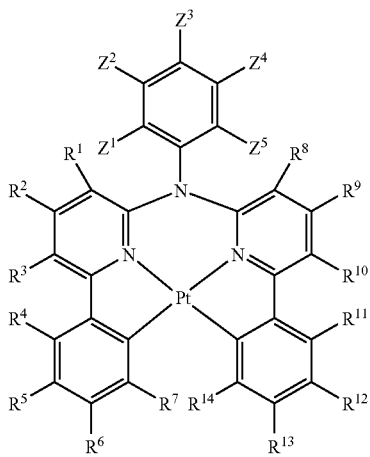

wherein, $R^1$-$R^7$ represent hydrogen or independently selected substituents, provided that $R^1$ and $R^2$, $R^2$ and $R^3$, $R^3$ and $R^4$, $R^4$ and $R^1$, $R^1$ and $R^6$, as well as $R^6$ and $R^7$ may combine to form a ring group;

$R^8$-$R^{14}$ represent hydrogen or independently selected substituents, provided that $R^8$ and $R^9$, $R^9$ and $R^{10}$, $R^{10}$ and $R^{11}$, $R^{11}$ and $R^{12}$, $R^{12}$ and $R^{13}$, as well as $R^{13}$ and $R^{14}$ may combine to form a ring group;

$Z^1$-$Z^5$ represent hydrogen or independently selected substituents, provided that $Z^1$ and $Z^2$, $Z^2$ and $Z^3$, $Z^3$ and $Z^4$, as well as $Z^4$ and $Z^5$ may combine to form a ring group.

Specific examples of phosphorescent emitters having tetradentate C,N-cyclometallating ligands suitable for use in the present invention include compounds X, Y, and Z represented below.

(EE)

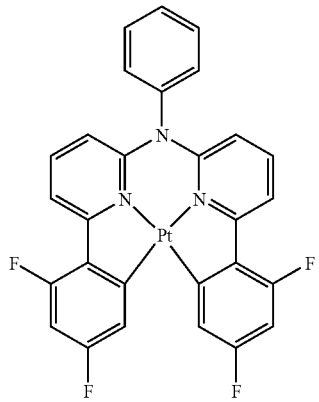

(FF)

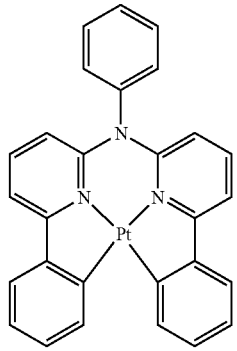

(GG)

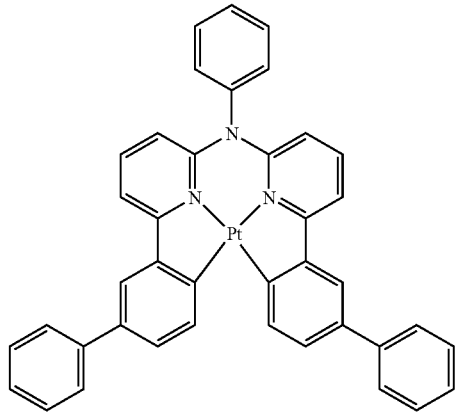

Phosphorescent emitters having tetradentate C,N-cyclometallating ligands may be synthesized by reacting the tetradentate C,N-cyclometallating ligand with a salt of the desired metal, such as $K_2PtCl_4$, in a proper organic solvent such as glacial acetic acid to form the phosphorescent emitter having tetradentate C,N-cyclometallating ligands. A tetraakylammonium salt such as tetrabutylammonium chloride can be used as a phase transfer catalyst to accelerate the reaction.

Other phosphorescent materials that do not involve C,N-cyclometallating ligands are known. Phosphorescent complexes of Pt(II), Ir(I), and Rh(I) with maleonitriledithiolate have been reported (C. E. Johnson et al., *J. Am. Chem. Soc.*, 105, 1795 (1983)). Re(I) tricarbonyl diimine complexes are also known to be highly phosphorescent (M. Wrighton and D. L. Morse, *J. Am. Chem. Soc.*, 96, 998 (1974); D. J. Stufkens, *Comments Inorg. Chem.*, 13, 359 (1992); V. W. W. Yam, *Chem. Commun.*, 789 (2001)). Os(II) complexes containing a combination of ligands including cyano ligands and bipyridyl or phenanthroline ligands have also been demonstrated in a polymer OLED (Y. Ma et al., *Synthetic Metals*, 94, 245 (1998)).

Porphyrin complexes such as 2,3,7,8,12,13,17,18-octaethyl-21H,23H-porphine platinum(II) are also useful phosphorescent materials.

Still other examples of useful phosphorescent materials include coordination complexes of the trivalent lanthanides such as $Tb^{3+}$ and $Eu^{3+}$ (J. Kido et al., *Chem. Lett.*, 657 (1990); *J. Alloys and Compounds*, 192, 30 (1993); *Jpn. J. Appl. Phys.*, 35, L394 (1996) and *Appl. Phys. Lett.*, 65, 2124 (1994)).

Additional information on suitable phosphorescent materials and synthetic methods, incorporated herein by reference, can be found in U.S. Pat. No. 6,303,238 B1, WO 00/57676, WO 00/70655, WO 01/41512 A1, US 2002/0182441 A1, US 2003/0017361 A1, US 2003/0072964 A1, U.S. Pat. No. 6,413,656 B1, U.S. Pat. No. 6,687,266 B1, US 2004/0086743 A1, US 2004/0121184 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, U.S. Pat. No. 6,677,060 B2, US 2003/0235712 A1, US 2004/0013905 A1, U.S. Pat. No. 6,733,905 B2, U.S. Pat. No. 6,780,528 B2, US 2003/0040627 A1, JP 2003059667A, JP 2003073665A, US 2002/0121638 A1, EP 1371708A1, US 2003/010877 A1, WO 03/040256 A2, US 2003/0096138 A1, US 2003/0173896 A1, U.S. Pat. No. 6,670,645 B2, US 2004/0068132 A1, WO 2004/015025 A1, US 2004/0072018 A1, US 2002/0134984 A1, WO 03/079737 A2, WO 2004/020448 A1, WO 03/091355 A2, U.S. Ser. No. 10/729,402, U.S. Ser. No. 10/729,712, U.S. Ser. No. 10/729,738, U.S. Ser. No. 10/729,238, U.S. Ser. No. 10/729,246 (now allowed), U.S. Ser. No. 10/729,207 (now allowed), U.S. Ser. No. 10/729,263 (now allowed), U.S. Ser. No. 10/879,412, and U.S. Ser. No. 10/879,657.

In addition to suitable hosts, an EL device employing a phosphorescent material often is more efficient if there is at least one exciton- or hole-blocking layer on the cathode side of the emitting layer. Efficiency can also often be improved if there are one or more exciton- or electron-blocking layers on the anode side of the emitting layer. These additional layers help confine the excitons or electron-hole recombination centers to the light-emitting layer comprising the host and emitting material.

An exciton- or hole-blocking layer is desirably placed between the electron-transporting layer and the light-emitting layer—see FIG. 1, Layer 135. The ionization potential of the blocking layer should be such that there is an energy barrier for hole migration from the host into the electron-transporting layer, while the electron affinity should be such that electrons pass more readily from the electron-transporting layer into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)Aluminum(III)(BAlq). Metal complexes other than BAlq are also known to block holes and excitons as described in US 20030068528.

In another embodiment, an exciton- or electron-blocking layer would be placed between the hole-transporting layer and the light-emitting layer (this layer is not shown in FIG. 1). As an example, US 20030175553 A1 describes the use of fac-tris(1-phenylpyrazolato-N,C2)iridium(III)(Irppz) in an electron/exciton blocking layer. U.S. Ser. No. 11/016,108 of Marina E. Kondavova et al., filed Dec. 17, 2004, describes further examples of exciton-blocking layers. Depending on the nature of the electron-transporting material and the configuration of the LEL, the blocking layer, in certain cases, can be entirely omitted.

In one suitable embodiment the EL device includes a means for emitting white light, which may include complimentary emitters, a white emitter, or a filtering means. The device may also include a fluorescent emitting material.

In one desirable embodiment the EL device is part of a display device. In another suitable embodiment the EL device is part of an area lighting device.

The EL device of the invention is useful in any device where stable light emission is desired such as a lamp or a component in a static or motion imaging device, such as a television, cell phone, DVD player, or computer monitor.

Embodiments of the invention may provide EL devices that have good luminance efficiency, good operational stability, and reduced drive voltages. Embodiments of the invention may also give reduced voltage rises over the lifetime of the devices and can be produced with high reproducibility and consistently to provide good light efficiency. They may have lower power consumption requirements and, when used with a battery, provide longer battery lifetimes.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituents unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as is alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropyl-sulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

There are numerous configurations of the organic layers wherein the present invention can be successfully practiced. Essential requirements are a cathode, an anode, a HTL and a LEL. A more typical structure is shown in FIG. 1 for OLED 100, and contains a substrate 110, an anode 120, an optional hole-injecting layer 130, a hole-transporting layer 132, a light-emitting layer 134, a hole-blocking layer 135, an electron-transporting layer 136, an optional electron-injecting layer 138 and a cathode 140. These layers are described in detail below. Note that the substrate may alternatively be located adjacent to the cathode, or the substrate may actually constitute the anode or cathode. Also, the total combined thickness of the organic layers is preferably less than 500 nm.

The light-emitting layer can be constructed of a single layer or multiple layers. If a single layer, it can be fabricated to emit any color of light, with the selection chosen depending on the application, and most notably from the red, green and blue regions of the spectrum. If the device is required to emit white light, then several layers emitting different colors of light with sufficient spectral breadth are needed so that when combined, white light is formed.

The anode and cathode of the OLED are connected to a voltage/current source 150, through electrical conductors 160. Applying a potential between the anode and cathode such that the anode is at a more positive potential than the cathode operates the OLED. Holes are injected into the organic EL element from the anode. Enhanced device stability can sometimes be achieved when the OLED is operated in an AC mode where, for some time period in cycle, the potential bias is reversed and no current flows. An example of an AC driven OLED is described in U.S. Pat. No. 5,552,678.

Substrate

The substrate 110 can either be light transmissive or opaque, depending on the intended direction of light emission. The light transmissive property is desirable for viewing the EL emission through the substrate. Transparent glass or organic material are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials. Of course it is necessary to provide in these device configurations a light-transparent top electrode.

Anode

The conductive anode layer 120 is commonly formed over the substrate and, when EL emission is viewed through the anode, it should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 120. For applications where EL emission is viewed through the top electrode, the transmissive characteristics of layer 120 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

While not always necessary, it is often useful that a hole-injecting layer 130 be provided between anode 120 and hole-transporting layer 132. The hole-injecting material can serve to improve the film formation property of subsequent organic layers and to facilitate injection of holes into the hole-transporting layer. Suitable materials for use in the hole-injecting layer include, but are not limited to, porphyrinic compounds such as those described in U.S. Pat. No. 4,720,432, and plasma-deposited fluorocarbon polymers such as those described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 132 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. Additionally, the hole-transporting layer may be constructed of one or more layers such that each layer can be doped or un-doped with the same or different light-emitting material. The thickness of the HTL can be any suitable thickness. It can be in the range of from 0.1 to 300 nm. In one form, the aromatic tertiary amine can be an arylamine, such as a monoarylamine, diarylamine, triarylamine, or a polymeric arylamine group. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural Formula (A).

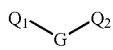

(A)

wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring group, e.g., a naphthalene. When G is an aryl group, it is conveniently a phenylene, biphenylene, or naphthalene group.

A useful class of triarylamine groups satisfying structural Formula (A) and containing two triarylamine groups is represented by structural Formula (B):

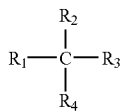

(B)

where
$R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural Formula (C):

(C)

wherein $R_5$ and $R_6$ are independently selected aryl groups. In one embodiment, at least one of $R_5$ or $R_6$ contains a polycyclic fused ring group, e.g., a naphthalene.

Another class of aromatic tertiary amine groups are the tetraaryldiamines. Desirable tetraaryldiamines groups include two diarylamino groups, such as indicated by Formula (C), linked through an arylene group. Useful tetraaryldiamines include those represented by Formula (D).

(D)

wherein
each Are is an independently selected arylene group, such as a phenylene or anthracene group,
n is an integer of from 1 to 4, and
Ar, $R_7$, $R_8$, and $R_9$ are independently selected aryl groups. In a typical embodiment, at least one of Ar, $R_7$, $R_8$, and $R_9$ is a polycyclic fused ring group, e.g., a naphthalene The various alkyl, alkylene, aryl, and arylene groups of the foregoing structural Formulae (A), (B), (C) and (D), can each in turn be substituted. Typical substituents include alkyl groups, alkoxy groups, aryl groups, aryloxy groups, and halogen such as fluoride, chloride, and bromide. The various alkyl and alkylene groups typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene groups are usually phenyl and phenylene moieties.

The hole-transporting layer can be formed of a single or a mixture of aromatic tertiary amine compounds. Specifically, one may employ a triarylamine, such as a triarylamine satisfying the Formula (B), in combination with a tetraaryldiamine, such as indicated by Formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl(NPB)

4,4'-Bis[N-(1-naphthyl)-N-(2-naphthyl)amino]biphenyl (TNB)
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis[di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine (MTDATA)
4,4'-Bis[N-(3-methylphenyl)-N-phenylamino]biphenyl (TPD Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Exciton Blocking Layer (EBL)

As described previously, an optional exciton- or electron-blocking layer may be present between the HTL and the LEL (not shown in FIG. 1). Some suitable examples of such blocking layers are described in U.S. Ser. No. 11/016,108 of Marina E. Kondavova et al., filed Dec. 17, 2004.

Light-Emitting Layer (LEL)

In addition to the phosphorescent emitters of this invention, which have been previously described, other light-emitting materials may be used in the OLED device, including fluorescent materials. Although the term "fluorescent" is commonly used to describe any light-emitting material, in this case we are referring to a material that emits light from a singlet excited state. Fluorescent materials may be used in the same layer as the phosphorescent material, in adjacent layers, in adjacent pixels, or any combination. Care must be taken not to select materials that will adversely affect the performance of the phosphorescent materials of this invention. One skilled in the art will understand that concentrations and triplet energies of materials in the same layer as the phosphorescent material or in an adjacent layer must be appropriately set so as to prevent unwanted quenching of the phosphorescence.

As more fully described in U.S. Pat. Nos. 4,769,292 and 5,935,721, the light-emitting layer(s) (LEL) 134 of the organic EL element comprises a luminescent or fluorescent material where electroluminescence is produced as a result of electron-hole pair recombination in this region. The light-emitting layer can be comprised of a single material, but more commonly consists of non-electroluminescent compounds doped with an electroluminescent guest compound or compounds where light emission comes primarily from the electroluminescent compound and can be of any color. The non-electroluminescent compound or compounds in the light-emitting layer can be an electron-transporting material, as defined below, a hole-transporting material, as defined above, or another material or combination of materials that support hole-electron recombination. The electroluminescent compound is usually chosen from highly fluorescent dyes, but phosphorescent compounds, e.g., transition metal complexes as described in WO 98/55561, WO 00/18851, WO 00/57676, and WO 00/70655 are also useful. Electroluminescent compounds can be coated as 0.01 to 50% into the non-electroluminescent component material, but typically coated as 0.01 to 30% and more typically coated as 0.01 to 15% into the non-electroluminescent component. The thickness of the LEL can be any suitable thickness. It can be in the range of from 0.1 nm to 100 mm.

An important relationship for choosing a dye as a electroluminescent component is a comparison of the bandgap potential which is defined as the energy difference between the highest occupied molecular orbital and the lowest unoccupied molecular orbital of the molecule. For efficient energy transfer from the non-electroluminescent compound to the electroluminescent compound molecule, a necessary condition is that the band gap of the electroluminescent compound is smaller than that of the non-electroluminescent compound or compounds.

Non-electroluminescent compounds and emitting molecules known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives (Formula E) constitute one class of useful non-electroluminescent component compounds capable of supporting electroluminescence, and are particularly suitable for light emission of wavelengths longer than 500 nm, e.g., green, yellow, orange, and red.

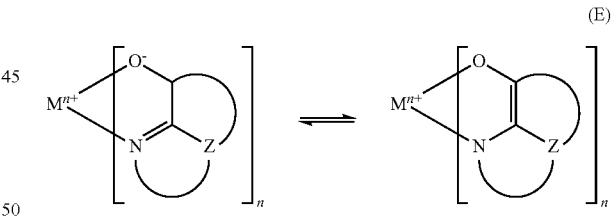

(E)

wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such as aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]
CO-10: Bis(2-methyl-8-quinolinato)-4-phenylphenolatoaluminum (III)

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

A preferred embodiment of the luminescent layer consists of a host material doped with fluorescent dyes. Using this method, highly efficient EL devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable details for EL devices using Alq as the host material.

Shi et al. in commonly assigned U.S. Pat. No. 5,935,721 has described this dopant scheme in considerable details for the blue emitting OLED devices using 9,10-di-(2-naphthyl) anthracene (ADN) derivatives as the host material.

Derivatives of 9,10-di-(2-naphthyl)anthracene (Formula F) constitute one class of useful non-electroluminescent compounds capable of supporting electroluminescence, and are particularly suitable for light emission of wavelengths longer than 400 nm, e.g., blue, green, yellow, orange or red.

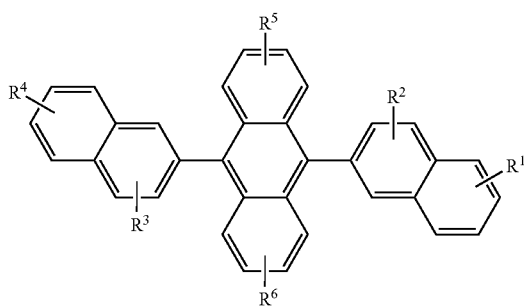

(F)

wherein: $R^1$, $R^2$, $R^3$, $R^4$, $R^5$, and $R^6$ represent hydrogen or one or more substituents selected from the following groups:

Group 1: hydrogen, alkyl and alkoxy groups typically having from 1 to 24 carbon atoms;

Group 2: a ring group, typically having from 6 to 20 carbon atoms;

Group 3: the atoms necessary to complete a carbocyclic fused ring group such as naphthyl, anthracenyl, pyrenyl, and perylenyl groups, typically having from 6 to 30 carbon atoms;

Group 4: the atoms necessary to complete a heterocyclic fused ring group such as furyl, thienyl, pyridyl, and quinolinyl groups, typically having from 5 to 24 carbon atoms;

Group 5: an alkoxylamino, alkylamino, and arylamino group typically having from 1 to 24 carbon atoms; and Group 6: fluorine, chlorine, bromine and cyano radicals.

Illustrative examples include 9,10-di-(2-naphthyl)anthracene (ADN) and 2-t-butyl-9,10-di-(2-naphthyl)anthracene (TBADN). Other anthracene derivatives can be useful as an non-electroluminescent compound in the LEL, such as diphenylanthracene and its derivatives, as described in U.S. Pat. No. 5,927,247. Styrylarylene derivatives as described in U.S. Pat. No. 5,121,029 and JP 08333569 are also useful non-electroluminescent materials for blue emission. For example, 9,10-bis[4-(2,2-diphenylethenyl)phenyl]anthracene, 4,4'-Bis(2,2-diphenylethenyl)-1,1'-biphenyl (DPVBi) and phenylanthracene derivatives as described in EP 681,019 are useful non-electroluminescent materials for blue emission. Another useful non-electroluminescent material capable of supporting electroluminescence for blue-light emission is H-1 and its derivatives shown as follows:

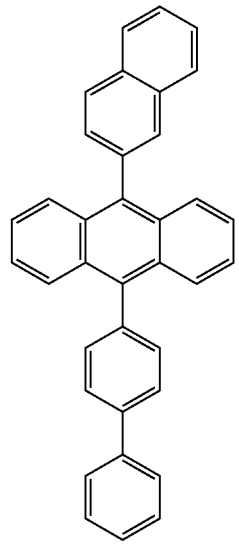

H-1

Benzazole derivatives (formula G) constitute another class of useful non-electroluminescent components capable of supporting electroluminescence, and are particularly suitable for light emission of wavelengths longer than 400 nm, e.g., blue, green, yellow, orange or red.

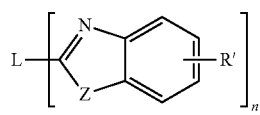

(G)

where:
n is an integer of 3 to 8;
Z is —O, —NR or —S where R is H or a substituent; and R' represents one or more optional substituents where R and each R' are H or alkyl groups such as propyl, t-butyl, and heptyl groups typically having from 1 to 24 carbon atoms; carbocyclic or heterocyclic ring groups such as phenyl and naphthyl, furyl, thienyl, pyridyl, and quinolinyl groups and atoms necessary to complete a fused aromatic ring group typically having from 5 to 20 carbon atoms; and halo such as chloro, and fluoro;

L is a linkage unit usually comprising an alkyl or aryl group which conjugately or unconjugately connects the multiple benzazoles together.

An example of a useful benzazole is 2,2',2"-(1,3,5-benzenetriyl)tris[1-phenyl-1H-benzimidazole], (TPBI).

Distyrylarylene derivatives as described in U.S. Pat. No. 5,121,029 are also useful non-electroluminescent component materials in the LEL.

Desirable fluorescent electroluminescent components include groups derived from fused ring, heterocyclic and other compounds such as anthracene, tetracene, xanthene, perylene, rubrene, pyran, rhodamine, quinacridone, dicyanomethylenepyran, thiopyran, polymethine, pyrilium thiapyrilium, and carbostyryl compounds. Illustrative examples of useful electroluminescent components include, but are not limited to, the following:

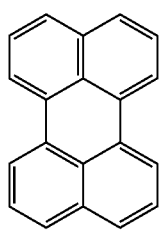

L1

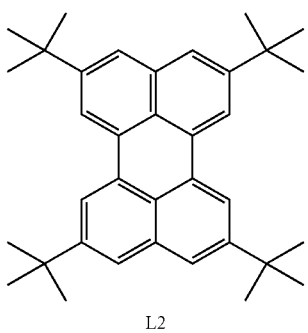

L2

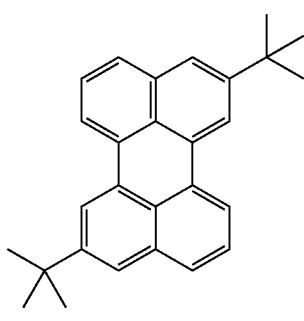

L3

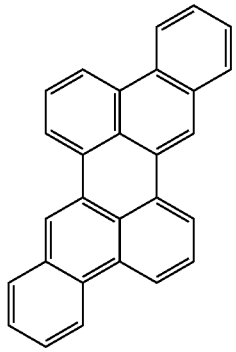

L4

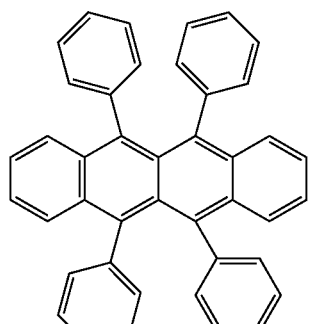

L5

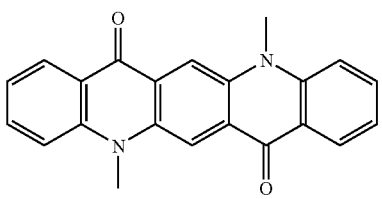

L6

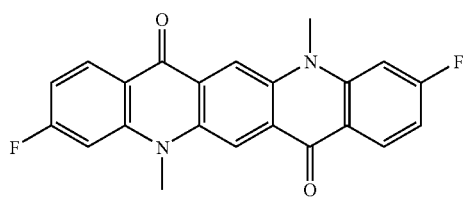

L7

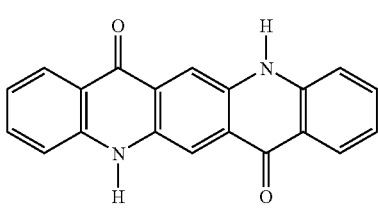

L8

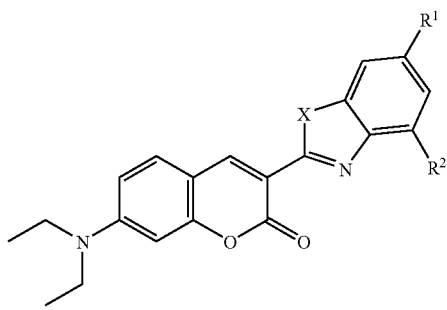

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

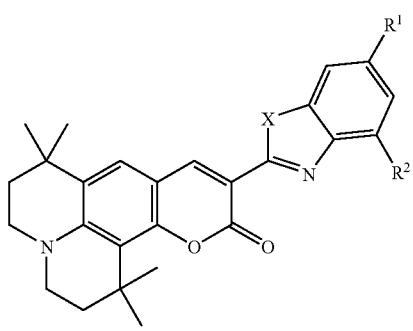

| | X | R1 | R2 |
|---|---|---|---|
| L23 | O | H | H |
| L24 | O | H | Methyl |
| L25 | O | Methyl | H |
| L26 | O | Methyl | Methyl |
| 127 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

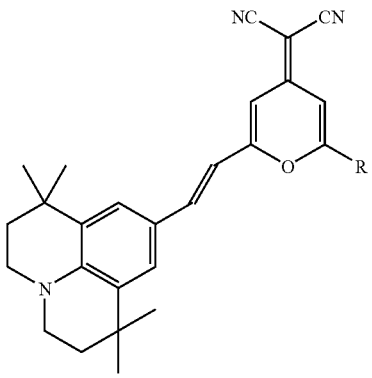

| | R |
|---|---|
| L37 | phenyl |
| L38 | methyl |
| L39 | t-butyl |
| L40 | mesityl |

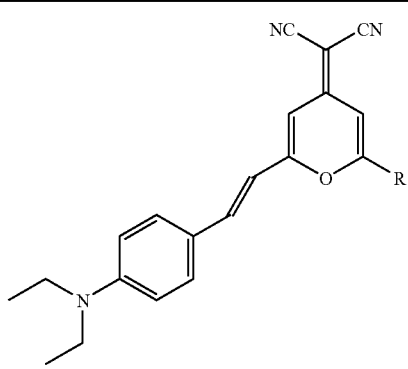

| | R |
|---|---|
| L41 | phenyl |
| L42 | methyl |
| L43 | t-butyl |
| L44 | mesityl |

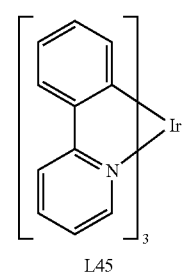

L45

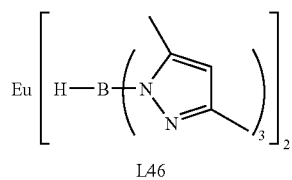

L46

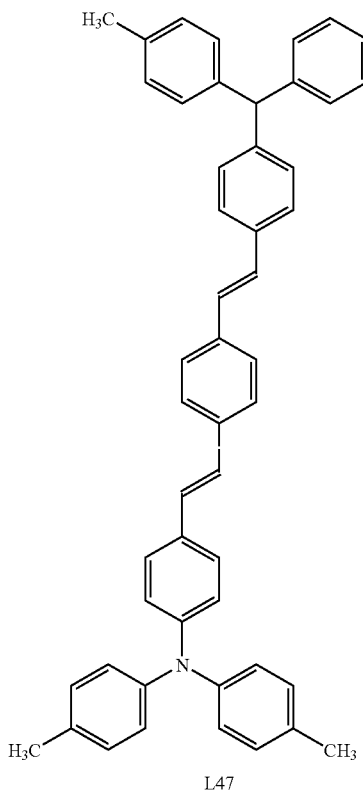

L47

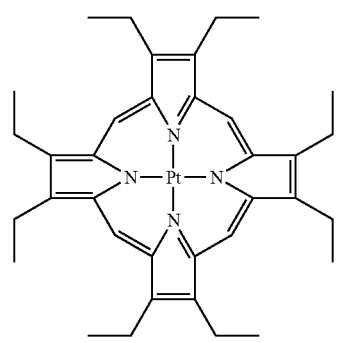

L48

Many blue fluorescent dopants are known in the art, and are contemplated for use in the practice of this invention. Blue dopants or light-emitting materials can be coated as 0.01 to 50% by weight into the host material, but typically coated as 0.01 to 30% and more typically coated as 0.01 to 15% by weight into the host material. The thickness of the blue-light-emitting can be any suitable thickness. It can be in the range of from 10 to 100 nm. Particularly useful classes of blue-emitting dopants include perylene and its derivatives such as 2,5,8,11-tetra-tert-butyl perylene (TBP), and distyrylamine derivatives as described in U.S. Pat. No. 5,121,029, such as L47 (structure shown above)

Another useful class of blue-emitting dopants is represented by Formula 2, known as a bis(azinyl0amine borane complex, and is described in commonly assigned U.S. Pat. No. 6,661,023 (Feb. 9, 2003) by Benjamin P. Hoag et al., entitled "Organic Element for Electroluminescent Devices"; the disclosure of which is incorporated herein.

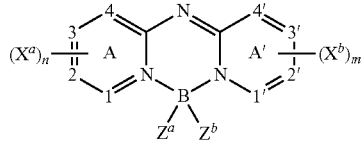

Formula 2 wherein:

A and A' represent independent azine ring systems corresponding to 6-membered aromatic ring systems containing at least one nitrogen;

each $X^a$ and $X^b$ is an independently selected substituent, two of which may join to form a fused ring to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Desirably, the azine rings are either quinolinyl or isoquinolinyl rings such that 1, 2, 3, 4, 1', 2', 3', and 4' are all carbon; m and n are equal to or greater than 2; and $X^a$ and $X^b$ represent at least two carbon substituents which join to form an aromatic ring. Desirably, $Z^a$ and $Z^b$ are fluorine atoms.

Preferred embodiments further include devices where the two fused ring systems are quinoline or isoquinoline systems; the aryl or heterocyclic substituent is a phenyl group; there are present at least two $X^a$ groups and two $X^b$ groups which join to form a 6-6 fused ring, the fused ring systems are fused at the 1-2, 3-4, 1'-2', or 3'-4' positions, respectively; one or both of the fused rings is substituted by a phenyl group; and where the dopant is depicted in Formulae 3, 4, or 5.

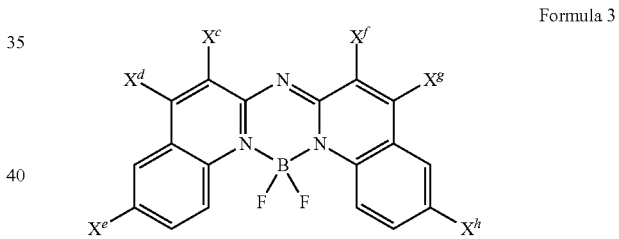

Formula 3

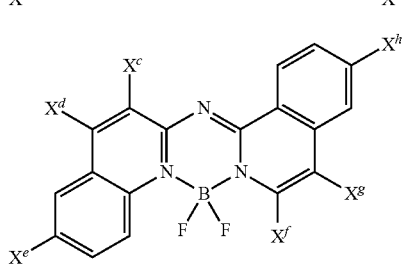

Formula 4

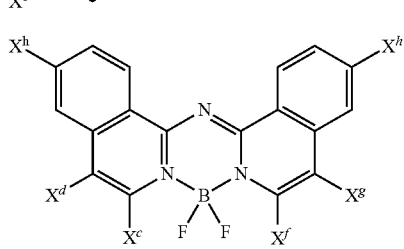

Formula 5 wherein each $X^c$, $X^d$, $X^e$, $X^f$, $X^g$, and $X^h$ is hydrogen or an independently selected substituent, one of which must be an aryl or heterocyclic group.

Desirably, the azine rings are either quinolinyl or isoquinolinyl rings such that 1, 2, 3, 4, 1', 2', 3', and 4' are all carbon;

m and n are equal to or greater than 2; and $X^a$ and $X^b$ represent at least two carbon substituents which join to form an aromatic ring, and one is an aryl or substituted aryl group. Desirably, $Z^a$ and $Z^b$ are fluorine atoms.

Illustrative, non-limiting examples of boron compounds complexed by two ring nitrogens of a deprotonated bis(azinyl)amine ligand, wherein the two ring nitrogens are members of different 6,6 fused ring systems in which at least one of the systems contains an aryl or heterocyclic substituent, useful in the present invention are the following:

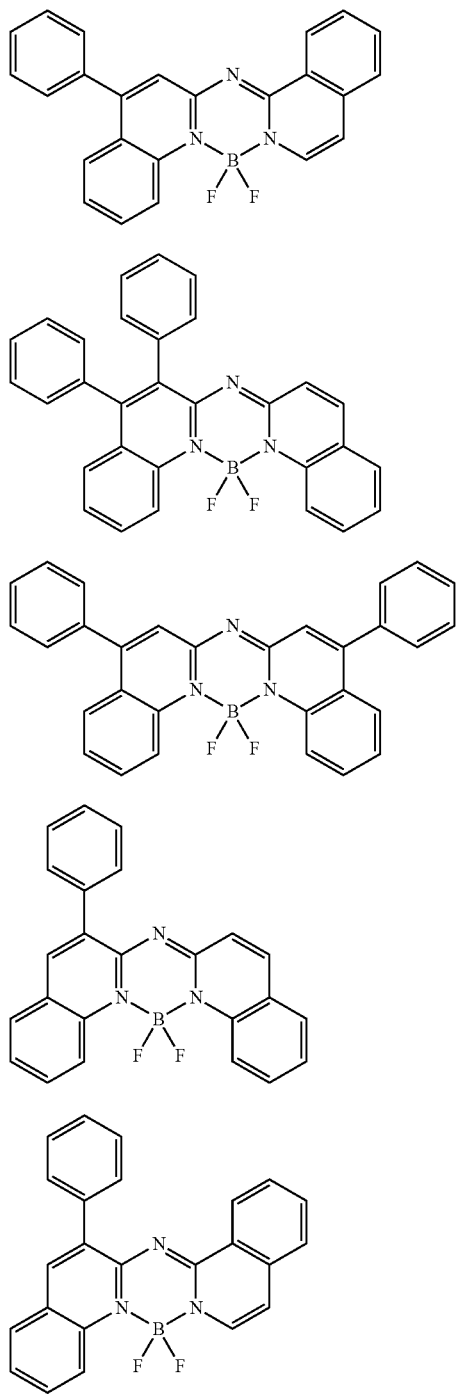

B-1

B-2

B-3

B-4

B-5

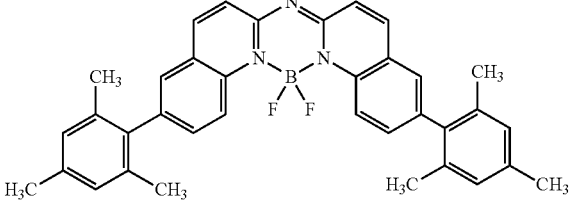

B-6

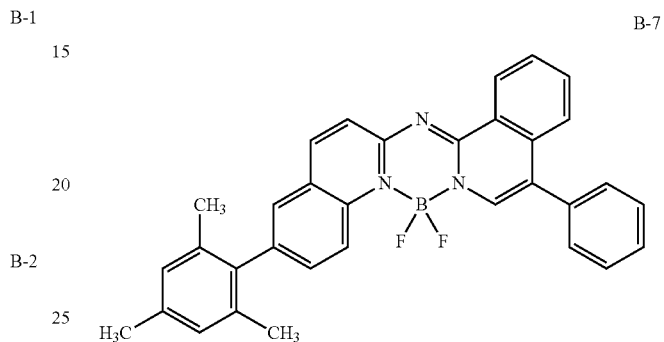

B-7

Coumarins represent a useful class of green-emitting dopants as described by Tang et al. in U.S. Pat. Nos. 4,769,292 and 6,020,078. Green dopants or light-emitting materials can be coated as 0.01 to 50% by weight into the host material, but typically coated as 0.01 to 30% and more typically coated as 0.01 to 15% by weight into the host material. Examples of useful green-emitting coumarins include C545T and C545TB. Quinacridones represent another useful class of green-emitting dopants. Useful quinacridones are described in U.S. Pat. No. 5,593,788, publication JP 09-13026A, and commonly assigned U.S. patent application Ser. No. 10/184,356 filed Jun. 27, 2002 by Lelia Cosimbescu, entitled "Device Containing Green Organic Light-Emitting Diode", the disclosure of which is incorporated herein.

Examples of particularly useful green-emitting quinacridones are shown below:

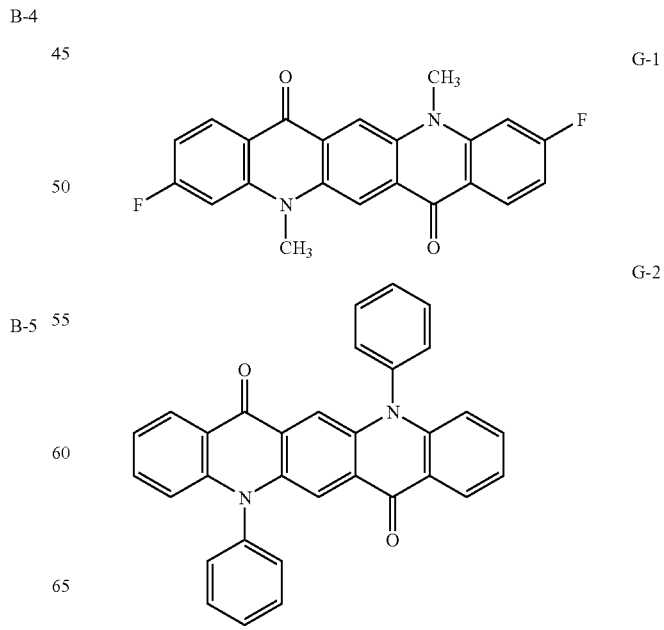

G-1

G-2

Formula 6 below represents another class of green-emitting dopants useful in the invention.

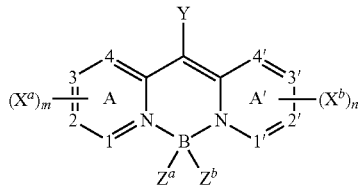

Formula 6 wherein:
A and A' represent independent azine ring systems corresponding to 6-membered aromatic ring systems containing at least one nitrogen;
each $X^a$ and $X^b$ is an independently selected substituent, two of which may join to form a fused ring to A or A';
m and n are independently 0 to 4;
Y is H or a substituent;
$Z^a$ and $Z^b$ are independently selected substituents; and
1, 2, 3, 4, 1', 2', 3', and 4' are independently selected as either carbon or nitrogen atoms.

In the device, 1, 2, 3, 4, 1', 2', 3', and 4' are conveniently all carbon atoms. The device may desirably contain at least one or both of ring A or A' that contains substituents joined to form a fused ring. In one useful embodiment, there is present at least one $X^a$ or $X^b$ group selected from the group consisting of halide and alkyl, aryl, alkoxy, and aryloxy groups. In another embodiment, there is present a $Z^a$ and $Z^b$ group independently selected from the group consisting of fluorine and alkyl, aryl, alkoxy and aryloxy groups. A desirable embodiment is where $Z^a$ and $Z^b$ are F. Y is suitably hydrogen or a substituent such as an alkyl, aryl, or heterocyclic group.

The emission wavelength of these compounds may be adjusted to some extent by appropriate substitution around the central bis(azinyl)methene boron group to meet a color aim, namely green. Some examples of useful Formulas follow:

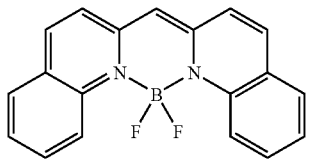

G-3

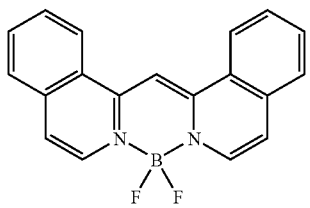

G-4

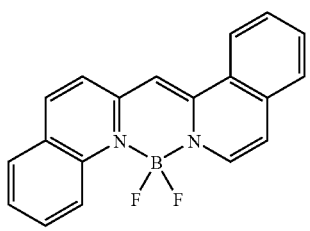

G-5

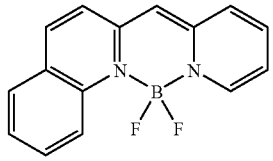

G-6

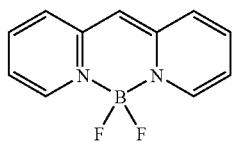

G-7

Naphthacenes and derivatives thereof also represent a useful class of emitting dopants, which can be used as stabilizers. These dopant materials can be coated as 0.01 to 50% by weight into the host material, but typically coated as 0.01 to 30% and more typically coated as 0.01 to 15% by weight into the host material. Naphthacene derivative Y-1 (alias t-BuDPN) below, is an example of a dopant material used as a stabilizer:

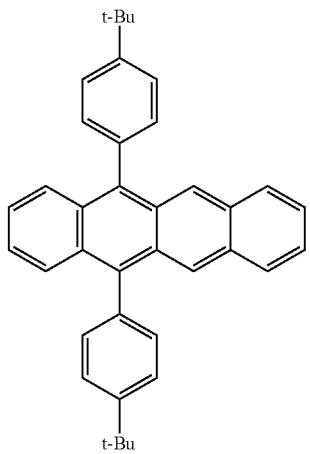

Y-1

Hole-Blocking Layer (HBL)

As described previously, in addition to suitable hosts and transporting materials, an OLED device according to the invention also includes at least one hole-blocking layer 135 placed between the electron-transporting layer 136 and the light-emitting layer 134 to help confine the excitons and recombination events to the light-emitting layer comprising co-hosts and a phosphorescent emitter. In this case, there should be an energy barrier for hole migration from co-hosts into the hole-blocking layer, while electrons should pass readily from the hole-blocking layer into the light-emitting layer comprising co-host materials and a phosphorescent emitter. The first requirement entails that the ionization potential of the hole-blocking layer 135 be larger than that of the light-emitting layer 134, desirably by 0.2 eV or more. The second requirement entails that the electron affinity of the hole-blocking layer 135 not greatly exceed that of the light-emitting layer 134, and desirably be either less than that of light-emitting layer or not exceed that of the light-emitting layer by more than about 0.2 eV.

When used with an electron-transporting layer whose characteristic luminescence is green, such as an Alq-containing electron-transporting layer as described below, the requirements concerning the energies of the highest occupied molecular orbital (HOMO) and lowest unoccupied molecular orbital (LUMO) of the material of the hole-blocking layer frequently result in a characteristic luminescence of the hole-blocking layer at shorter wavelengths than that of the electron-transporting layer, such as blue, violet, or ultraviolet luminescence. Thus, it is desirable that the characteristic luminescence of the material of a hole-blocking layer be blue, violet, or ultraviolet. It is further desirable that the triplet energy of the hole-blocking material be greater than that of the phosphorescent material. Suitable hole-blocking materials are described in WO 00/70655A2, WO 01/41512 and WO 01/93642 A1. Two examples of useful hole-blocking materials are bathocuproine (BCP) and bis(2-methyl-8-quinolinolato)(4-phenylphenolato)aluminum(III) (BAlq). The characteristic luminescence of BCP is in the ultraviolet, and that of BAlq is blue. Metal complexes other than BAlq are also known to block holes and excitons as described in US 20030068528. When a hole-blocking layer is used, its thickness can be between 2 and 100 nm and suitably between 5 and 10 nm.

Electron-Transporting Layer (ETL)

The electron transport layer has been discussed previously. Preferred thin film-forming materials for use in forming the electron-transporting layer of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula (G) are also useful electron-transporting materials.

In some instances, the electron transport and light-emitting layers can optionally be collapsed into a single layer that serves the function of supporting both light emission and electron-transportation. The thickness of the ETL can be any suitable thickness. It can be in the range of from 0.1 nm to 10 nm.

Cathode

When light emission is through the anode, the cathode layer 140 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. Cathode materials are comprised of Mg:Ag, Al:Li and Mg:Al alloys. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. No. 5,059,861, U.S. Pat. No. 5,059,862, and U.S. Pat. No. 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care must be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition: These powders, flakes, or granules are difficult to handle. These organic materials generally have a relatively low physical density and undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; This can lead to nonuniform heating of such organic materials in physical vapor deposition sources.

Therefore, result in potentially nonuniform vapor-deposited organic layers formed on a substrate.

These organic powders can be consolidated into a solid pellet. These solid pellets consolidating into a solid pellet from a mixture of a sublimable organic material powder are easier to handle. Consolidation of organic powder into a solid pellet can be accomplished with relatively simple tools. A solid pellet formed from mixture comprising one or more non-luminescent organic non-electroluminescent component materials or luminescent electroluminescent component materials or mixture of non-electroluminescent component and electroluminescent component materials can be placed into a physical vapor deposition source for making organic layer. Such consolidated pellets can be used in a physical vapor deposition apparatus.

In one aspect, the present invention provides a method of making an organic layer from compacted pellets of organic materials on a substrate, which will form part of an OLED.

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585; U.S. Ser. No. 10/805,980; U.S. Ser. No. 10/945,940; U.S. Ser. No. 10/945,941; U.S. Ser. No. 11/050,924; and U.S. Ser. No. 11/050,934. Using this second method, each material may be evaporated using different source evaporators or the solid materials may be mixed prior to evaporation using the same source evaporator.

Encapsulation

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the cover or as part of the cover.

The invention and its advantages are further illustrated by the specific examples that follow. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

Example 1

Synthesis of Compound A-16

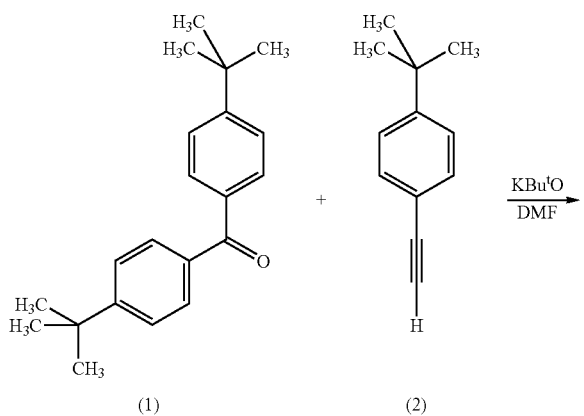

(eq. 1)

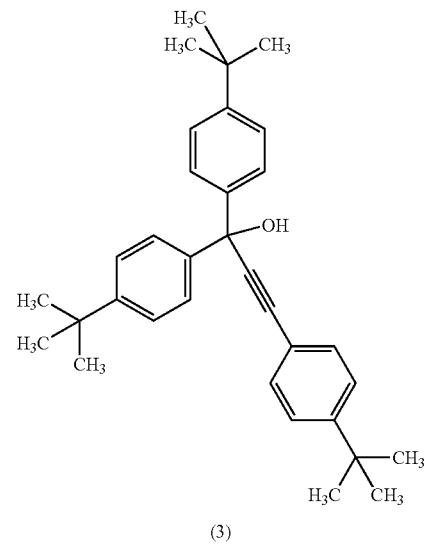

-continued (3) $\xrightarrow[\text{2. collidine/xylenes}]{\text{1. CH}_3\text{SO}_2\text{Cl/CH}_2\text{Cl}_2/\text{NEt}_3}$ (eq. 2)

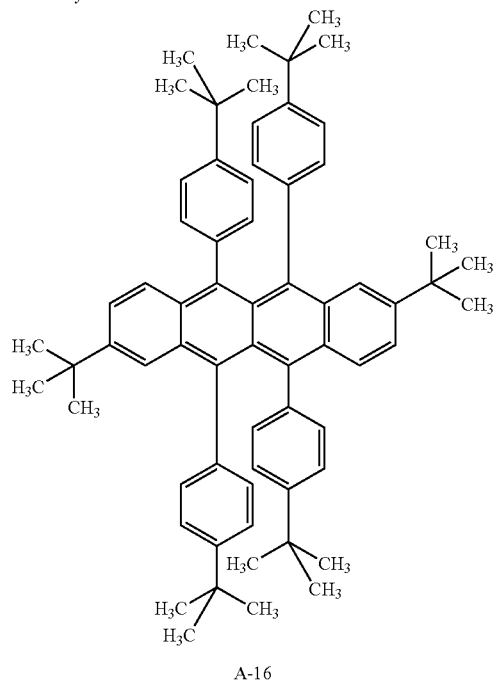

A-16

Compound (3), eq. 1, was prepared in the following manner. Under a nitrogen atmosphere, acetylenic compound (2) (2.0 g, 12 mMole), was dissolved in dimethylformamide (DMF) (100 mL) and the solution cool to 0° C. Potassium t-butoxide (KBu$^t$O) (1.4 g, 12 mMole), was added and the mixture stirred well for approximately 15 minutes. To this mixture was then added the benzophenone (1) (3.53 g, 30 mMole). Stirring was continued at 0° C. for approximately 30 minutes and then allowed to come to room temperature over a 1-hour period. At the end of this time the solution was cooled to 0° C. and the reaction treated with saturated sodium chloride (20 mL). The mixture was then diluted with ethyl acetate, washed with 2N—HCl (3 times), dried over MgSO$_4$, filtered and concentrated under reduced pressure. The crude product was triturated with petroleum ether to give the product as an off-white solid. The yield of compound (3) was 3.0 g.

Compound (3) (7.0 g, 15 mMole) was dissolved in methylene chloride (CH$_2$Cl$_2$) (70 mL), and stirred at 0° C. under a nitrogen atmosphere. To this solution was added triethylamine (NEt$_3$) (1.56 g, 15 mMole) and then the mixture was treated drop by drop with methanesulfonyl chloride (CH$_3$SO$_2$Cl) (1.92 g, 15 mMole), keeping the temperature of the reaction in the range 0-5° C. After the addition, the solution was stirred at 0° C. for 30 minutes, and then allowed to warm to room temperature over 1 hour. The reaction was then heated to reflux, distilling off the methylene chloride solvent. The methylene chloride solvent was gradually replaced by adding xylenes (a total of 70 mL). When the internal temperature of the reaction reached 80° C., collidine (2.40 g, 19.82 mMole), dissolved in xylenes (10 mL) was added drop by drop over a 10-minute period. The temperature was then raised to 110° C. and held at this temperature for 4 hours. After this period the reaction was cooled and concentrated under reduced pressure. The oily residue was stirred with methanol (70 mL) to give the crude product. This material was filtered off, washed with methanol and petroleum ether to give inventive compound A-16 as a bright red solid. The yield was 1.5 g and A-16 had a melting point of 300-305° C. The product may be further purified by sublimation (250° C. @ 200 millitorr) with a N$_2$ carrier gas.

Example 2

Determination of LUMO Values

An important relationship exists when selecting the first compound and second compound(s) of the invention. A comparison of the LUMO values of the first and second compounds in the layer of the invention must be carefully considered. To obtain a drive voltage reduction over devices that contain only a first compound or only a second compound, there must be a difference in the LUMO values of the compounds. The first compound must have a lower LUMO (more negative) value than the second compound, or compounds.

The LUMO values are typically determined experimentally by electrochemical methods. A Model CHI660 electrochemical analyzer (CH Instruments, Inc., Austin, Tex.) was employed to carry out the electrochemical measurements. Cyclic voltammetry (CV) and Osteryoung square-wave voltammetry (SWV) were used to characterize the redox properties of the compounds of interest. A glassy carbon (GC) disk electrode (A=0.071 cm$^2$) was used as working electrode. The GC electrode was polished with 0.05 µm alumina slurry, followed by sonication cleaning in Milli-Q deionized water twice and rinsed with acetone in between water cleaning. The electrode was finally cleaned and activated by electrochemical treatment prior to use. A platinum wire served as counter electrode and a saturated calomel electrode (SCE) was used as a quasi-reference electrode to complete a standard 3-electrode electrochemical cell. Ferrocene (Fc) was used as an internal standard (E$_{Fc}$=0.50 V vs. SCE in 1:1 acetonitrile/toluene, 0.1 M TBAF). A mixture of acetonitrile and toluene (50%/50% v/v, or 1:1) was used as the organic solvent system. The supporting electrolyte, tetrabutylammonium tetrafluoroborate (TBAF) was recrystallized twice in isopropanol and dried under vacuum. All solvents used were low water grade (<20 ppm water). The testing solution was purged with high purity nitrogen gas for approximately 5 minutes to remove oxygen and a nitrogen blanket was kept on the top of the solution during the course of the experiments. All measurements were performed at ambient temperature of 25±1° C. The oxidation and reduction potentials were determined either by averaging the anodic peak potential (Ep,a) and cathodic peak potential (Ep,c) for reversible or quasi-reversible electrode processes or on the basis of peak potentials (in SWV) for irreversible processes. All LUMO values pertaining to this application are calculated from the following:

Formal reduction potentials vs. SCE for reversible or quasi-reversible processes;

$$E^{o\prime}_{red}=(E_{pa}+E_{pc})/2$$

Formal reduction potentials vs. Fc;

$$E^{o\prime}_{red} \text{ vs. } Fc = (E^{o\prime}_{red} \text{ vs. } SCE) - E_{Fc}$$

where E$_{Fc}$ is the oxidation potential E$_{ox}$, of ferrocene;
Estimated lower limit for LUMO;

$$LUMO = HOMO_{Fc} - (E^{o\prime}_{red} \text{ vs. } Fc)$$

where HOMO$_{Fc}$ (Highest Occupied Molecular Orbital for ferrocene)=−4.8 eV.

The LUMO values for some first and second compounds are listed in Table 1. To make a selection of compounds useful in the invention, the first compound should have a lower LUMO value than its paired second compound(s).

TABLE 1

LUMO Values for Representative Materials

| Material | LUMO (eV) |
|---|---|
| A-7 (B-1) | −2.50 |
| A-8 (B-2) | −2.50 |
| A-10 | −2.44 |
| A-11 | −2.45 |
| A-12 | −2.40 |
| A-13 | −2.77 |
| A-14 | −2.83 |
| A-15 | −3.02 |
| A-16 | −2.72 |
| A-17 | −3.24 |
| A-18 | −2.52 |
| A-19 | −2.83 |
| A-22 | −2.35 |
| B-4 | −2.4 |
| B-5 | −2.3 |
| B-6 | −2.3 |
| Liq[1] | −1.85 |

[1] Liq represents lithium quinolate.

Example 3

Determination of Low-Voltage Electron Transport Materials

Materials were tested to determine if they were low voltage electron transport materials by incorporating them alone into the electron-transporting layer of a device. Devices were constructed in the following manner.

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon ($CF_x$) hole-injecting layer (HIL) by plasma-assisted deposition of $CHF_3$.

b) A hole-transporting layer (HTL) of N,N'-di-1-naphthalenyl-N,N'-diphenyl-4,4'-diaminobiphenyl (NPB) having a thickness of 75 nm was then evaporated onto a).

c) A 35 nm light-emitting layer (LEL) of tris(8-quinolinolato)aluminum (III) (Alq) was then deposited onto the hole-transporting layer.

d) A 35 nm electron-transporting layer (ETL) of the materials to be tested was then deposited onto the light-emitting layer.

e) On top of the ETL was deposited a 0.5 nm layer of LiF.

f) On top of the LiF layer was deposited a 130 nm layer of Al to form the cathode.

The above sequence completed the deposition of the EL device. The device was then hermetically packaged in a dry glove box for protection.

Low voltage electron transport materials are materials that when incorporated alone into the electron-transporting layer, as described above, result in test voltages of 12 volts or less. Low voltage electron transport materials with test voltages of 11 volts, or more suitably 10 volts or less are also useful as second compounds of the invention while materials of 9 or 8 volts or less are preferred as second compounds. Materials tested for low drive voltages and the results are shown in Table 2.

TABLE 2

Examples of Low Voltage Electron Transport Materials

| Sample | Material | Type | Voltage (V) | Relative Voltage[1] |
|---|---|---|---|---|
| 3-1 | B-1 (Alq) | Low | 8.0 | 100 |
| 3-2 | B-5 | Low | 9.9 | 124 |
| 3-3 | B-6 | Low | 8.3 | 104 |
| 3-4 | A-10 | High | 13.7 | 171 |
| 3-5 | A-13 | High | 15.4 | 192 |
| 3-6 | A-18 | High | 16.5 | 206 |
| 3-7 | CBP[2] | High | 14.3 | 179 |
| 3-8 | Liq[2] | High | 12.1 | 151 |

[1] Voltage relative to B-1 (Alq)
[2] CBP represents 4,4'-N,N'-dicarbazole-biphenyl
[3] Liq represents lithium quinolate.

Table 2 shows that compounds B-1, B-5 and B-6 qualify as low voltage electron transport materials, while A-10, A-13, A-18 and CBP do not.

In one embodiment, low voltage electron transport materials have a test voltage, when examined in the manner shown in Example 3, no more than 50% higher than Alq and desirably no more than 25% higher than Alq.

Example 4

Fabrication of EL Devices 4-1 thorough 4-6

EL devices, 4-1 through 4-6, satisfying the requirements of the invention and for the purposes of comparison, were constructed in the following manner.

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon ($CF_x$) hole-injecting layer (HIL) by plasma-assisted deposition of $CHF_3$.

b) A hole-transporting layer (HTL) of N,N'-di-1-naphthalenyl-N,N'-diphenyl-4,4'-diaminobiphenyl (NPB) having a thickness of 75 nm was then evaporated onto a).

c) A 35 nm light-emitting layer (LEL) of 4,4'-N,N'-dicarbazol-biphenyl (CBP) and 6% of tris(2-phenyl-pyridinato-N,$C^{2'}$-)Iridium (III) ($Ir(ppy)_3$) was then deposited onto the hole-transporting layer.

d) A 10 nm hole-blocking layer of bis(2-methyl-8-quinolinolato)(4-phenylphenolato)aluminum(III) (BAlq) was then deposited on the light-emitting layer.

e) A 35 nm electron-transporting layer (ETL) including A-16 or B-1 or mixtures of the two, as indicated in indicated in Table 3, was then deposited onto the light-emitting layer.

f) On top of the ETL was deposited a 0.5 nm layer of LiF electron-injecting layer.

g) On top of the LiF layer was deposited a 200 nm layer of Al to form the cathode.

The above sequence completed the deposition of the EL device. The device was then hermetically packaged in a dry glove box for protection.

The cells thus formed were tested for luminous efficiency and color at an operating current of 20 $mA/cm^2$ and the results are reported in Table 3a in the form of efficiency (w/A), luminance yield (cd/A) and voltage (V).

Figure 2:
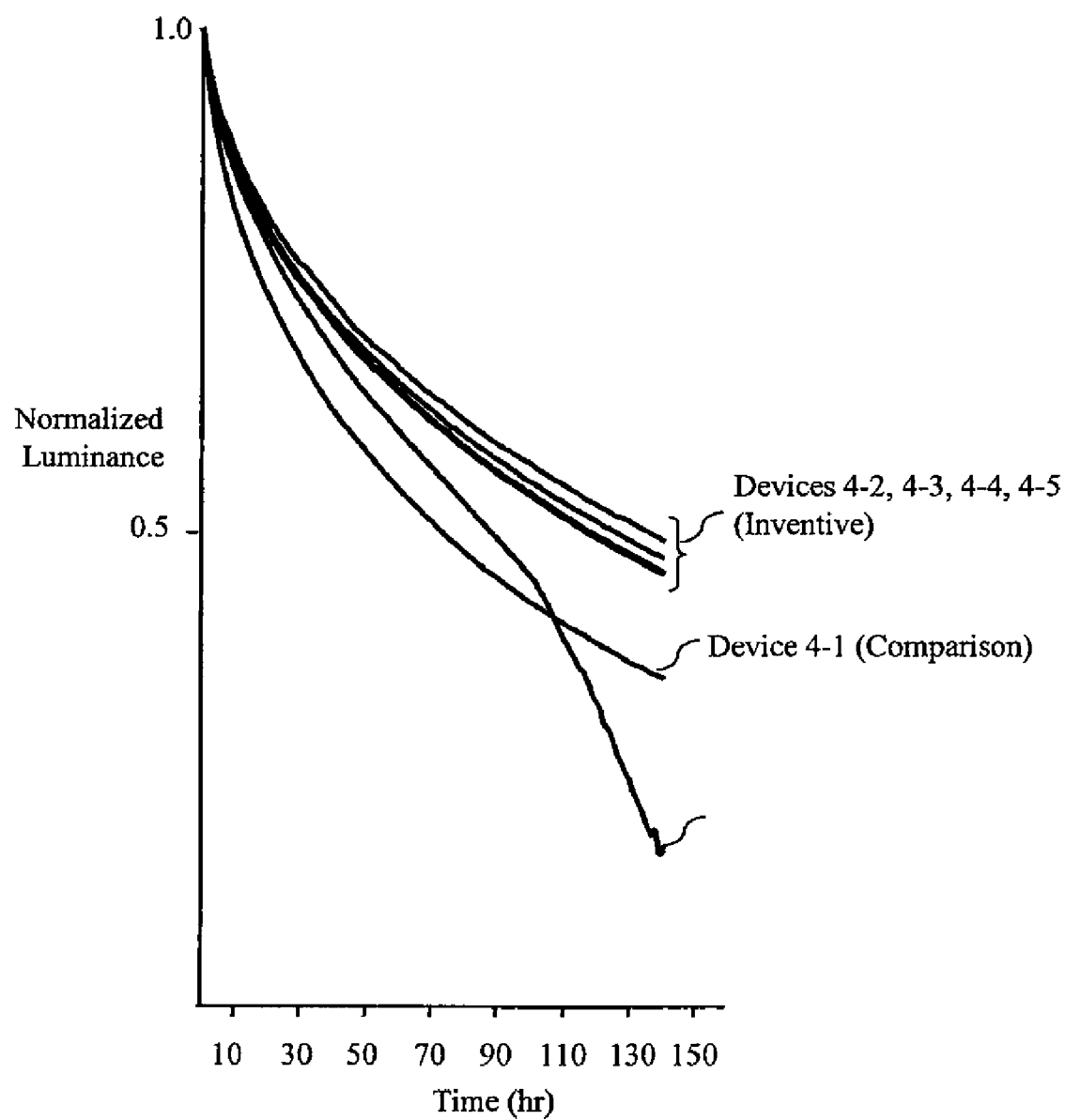
FIG. 2 is a graph of the results from Example 4 showing the change in normalized luminance with time for comparative devices 4-1 and 4-6, and inventive devices 4-2, 4-3, 4-4, and 4-5.

The operational stability of these devices was also tested at a current density of 20 $mA/cm^2$ and at ambient temperature. The time for the operating devices to fade to one half the initial luminance ($T_{50\%}$) is reported in Table 3b. The increase in voltage after 140 hours of operation is given as a percent change in voltage (Table 3b). FIG. 2 shows the change in the relative luminance for the devices with time (in hr), wherein the luminance of each device was normalized initially.

TABLE 3a

Device performance from Example 4.

| Device | % First Compound (A-16) | % Second Compound (B-1) | Efficiency (W/A) | Luminous Yield (Cd/A) | Voltage (V) |
|---|---|---|---|---|---|
| 4-1 Comparison | 0 | 100 | 0.203 | 31.3 | 12.2 |
| 4-2 Inventive | 10 | 90 | 0.190 | 29.0 | 13.4 |
| 4-3 Inventive | 25 | 75 | 0.191 | 29.2 | 12.7 |
| 4-4 Inventive | 50 | 50 | 0.201 | 30.7 | 11.5 |
| 4-5 Inventive | 75 | 25 | 0.203 | 31.1 | 10.5 |
| 4-6 Comparison | 100 | 0 | 0.179 | 27.5 | 14.0 |

TABLE 3b

Additional device performance from Example 4.

| Device | % First Compound (A-16) | % Second Compound (B-1) | Voltage Change[1] | $T_{50\%}$ (hours) |
|---|---|---|---|---|
| 4-1 Comparison | 0 | 100 | 66.3% | 68.9 |
| 4-2 Inventive | 10 | 90 | 55.5% | 111.5 |
| 4-3 Inventive | 25 | 75 | 52.3% | 127.9 |
| 4-4 Inventive | 50 | 50 | 55.8% | 110.2 |
| 4-5 Inventive | 75 | 25 | 54.0% | 118.2 |
| 4-6 Comparison | 100 | 0 | 83.5% | 84.3 |

[1]After 140 hours of operation.

It can be seen from Table 3a and 3b that the devices give very high luminance and that the inventive devices had lower voltage, longer lifetimes or both relative to the comparison devices. The inventive devices also give a lower voltage rise during operation. It can be seen from FIG. 2, that the inventive devices give enhanced operational stability relative to the comparative devices.

Example 5

Fabrication of OLED Devices 5-1 through 5-6

EL devices, 5-1 through 5-6, satisfying the requirements of the invention and for the purposes of comparison, were constructed in the same manner as those described in Example 4, except the 35 nm electron-transporting layer (ETL) layer contained a mixture of:

1) A-16 and 2% lithium metal, or

2) B-1 and 2% lithium metal, or

3) A-16, B-1, and 2% lithium metal, the percentages B-1 and A-16 in each device are indicated in indicated in Table 4.

The cells thus formed were tested for luminous efficiency and color at an operating current of 20 mA/cm$^2$ and the results are reported in Table 4 in the form of efficiency (w/A), luminance yield (cd/A), and voltage (V).

TABLE 4

Device performance from Example 5[1].

| Device | % First Compound (A-16) | % Second Compound (B-1) | Efficiency (W/A) | Luminous Yield (Cd/A) | Voltage (V) | $T_{50\%}$ (hours) |
|---|---|---|---|---|---|---|
| 5-1 Comparison | 0 | 98 | 0.205 | 31.4 | 11.0 | 95.0 |
| 5-2 Inventive | 9 | 89 | 0.205 | 31.6 | 10.6 | 91.2 |
| 5-3 Inventive | 24 | 74 | 0.203 | 31.2 | 10.1 | 111.0 |
| 5-4 Inventive | 49 | 49 | 0.199 | 30.6 | 10.2 | 117.6 |
| 5-5 Inventive | 74 | 24 | 0.197 | 30.3 | 10.8 | 102.4 |
| 5-6 Comparison | 98 | 0 | 0.204 | 31.3 | 14.6 | 2.0 |

[1]All devices also contain 2% Li in the electron-transporting layer.

It can be seen from Table 4 that the inventive devices had lower voltage, longer lifetimes or both relative to the comparison devices.

Example 6

Fabrication of OLED Devices 6-1 Thorough 6-6

EL devices, 6-1 through 6-6, satisfying the requirements of the invention and for the purposes of comparison, were constructed in the following manner.

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CF$_x$) hole-injecting layer (HIL) by plasma-assisted deposition of CHF$_3$.

b) A hole-transporting layer (HTL) of N,N'-di-1-naphthalenyl-N,N'-diphenyl-4,4'-diaminobiphenyl (NPB) having a thickness of 115 nm was then evaporated onto a).

c) A 35 nm light-emitting layer (LEL) including 83% bis(2-methyl-8-quinolinolato)(4-phenylphenolato)aluminum (III) (BAlq), 15% NPB and 2% of tris(1-phenylisoquinolinato-N,C$^{2'}$)Iridium(III)(Ir(1-piq)$_3$) was then deposited onto the hole-transporting layer.

d) A 10 nm hole-blocking layer of bis(2-methyl-8-quinolinolato)(4-phenylphenolato)aluminum(III) (BAlq) was then deposited on the light-emitting layer.

e) A 35 nm electron-transporting layer (ETL) including A-16 or B-1 or mixtures of the two, as indicated in indicated in Table 5, was then deposited onto the light-emitting layer.

f) On top of the ETL was deposited a 0.5 nm layer of LiF.

g) On top of the LiF layer was deposited a 100 nm layer of Al to form the cathode.

The above sequence completed the deposition of the EL device. The device was then hermetically packaged in a dry glove box for protection.

The cells thus formed were tested for luminous efficiency and color at an operating current density of 20 mA/cm$^2$ and the results are reported in Table in the form of efficiency (w/A), luminance yield (cd/A), and voltage (V).

TABLE 5

Device performance from Example 6.

| Device | % First Compound (A-16) | % Second Compound (B-1) | Efficiency (W/A) | Luminous Yield (Cd/A) | Voltage (V) |
|---|---|---|---|---|---|
| 6-1 Comparison | 0 | 100 | 0.200 | 9.79 | 10.2 |
| 6-2 Inventive | 10 | 90 | 0.158 | 8.35 | 11.4 |
| 6-3 Inventive | 25 | 75 | 0.161 | 8.33 | 11.1 |
| 6-4 Inventive | 50 | 50 | 0.180 | 8.96 | 9.8 |
| 6-5 Inventive | 75 | 25 | 0.190 | 9.30 | 9.1 |
| 6-6 Comparison | 100 | 0 | 0.167 | 8.13 | 13.8 |

It can be seen from Table 5 that the inventive devices wherein the first compound was at 50% or 75% had lower voltages relative to the comparison devices.

Example 7

Fabrication of Light-Emitting Devices 7-1 through 7-6

EL devices, 7-1 through 7-6, satisfying the requirements of the invention and for the purposes of comparison, were constructed in the following in the same manner as those described in Example 6, except the 35 nm electron-transporting layer (ETL) layer contained a mixture of:

1) A-16 and 2% lithium metal, or
2) B-1 and 2% lithium metal, or
3) A-16, B-1, and 2% lithium metal, the percentages B-1 and A-16 in each device are indicated in indicated in Table 6.

The cells thus formed were tested for luminous efficiency and color at an operating current density of 20 mA/cm$^2$ and the results are reported in Table 6 in the form of efficiency (w/A), luminance yield (cd/A), and voltage (V).

TABLE 6

Device performance from Example 7.[1]

| Device | % First Compound (A-16) | % Second Compound (B-1) | Efficiency (W/A) | Luminous Yield (Cd/A) | Voltage (V) |
|---|---|---|---|---|---|
| 7-1 Comparison | 0 | 98 | 0.174 | 8.42 | 12.2 |
| 7-2 Inventive | 9 | 89 | 0.184 | 8.98 | 11.5 |
| 7-3 Inventive | 24 | 74 | 0.182 | 8.81 | 9.2 |
| 7-4 Inventive | 49 | 49 | 0.188 | 9.09 | 9.0 |
| 7-5 Inventive | 74 | 24 | 0.181 | 8.78 | 9.3 |
| 7-6 Comparison | 98 | 0 | 0.194 | 9.41 | 13.3 |

[1]All devices also contain 2% Li in the electron-transporting layer.

It can be seen from Table 6 that the inventive devices had lower drive voltage relative to the comparison devices.

Example 8

Fabrication of OLED Devices 8-1 thorough 8-6

EL devices, 8-1 through 8-6, satisfying the requirements of the invention and for the purposes of comparison, were constructed in the following manner.

A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon (CF$_x$) hole-injecting layer (HIL) by plasma-assisted deposition of CHF$_3$.

b) A hole-transporting layer (HTL) of N,N'-di-1-naphthalenyl-N,N'-diphenyl-4,4'-diaminobiphenyl (NPB) having a thickness of 115 nm was then evaporated onto a).

c) A 35 nm light-emitting layer (LEL) including 92% bis (2-methyl-8-quinolinolato)(4-phenylphenolato)aluminum (III) (BAlq) and 8% of tris(1-phenylisoquinolinato-N,C$^{2'}$) Iridium(III) (Ir(1-piq)$_3$) was then deposited onto the hole-transporting layer.

d) A 10 nm hole-blocking layer of bis(2-methyl-8-quinolinolato)(4-phenylphenolato)aluminum(III) (BAlq) was then deposited on the light-emitting layer.

e) A 40 nm electron-transporting layer (ETL) including A-16 or B-1 or mixtures of the two, as indicated in indicated in Table 7, was then deposited onto the light-emitting layer.

f) On top of the ETL was deposited a 0.5 nm layer of LiF.

g) On top of the LiF layer was deposited a 100 nm layer of Al to form the cathode.

The above sequence completed the deposition of the EL device. The device was then hermetically packaged in a dry glove box for protection.

The cells thus formed were tested for luminous efficiency and color at an operating current density of 20 mA/cm$^2$ and the results are reported in Table 7 in the form of efficiency (w/A), luminance yield (cd/A), and voltage (V).

TABLE 7

Device performance from Example 8.

| Device | % First Compound (A-16) | % Second Compound (B-1) | Efficiency (W/A) | Luminous Yield (Cd/A) | Voltage (V) |
|---|---|---|---|---|---|
| 8-1 Comparison | 0 | 100 | 0.134 | 6.23 | 14.5 |
| 8-2 Inventive | 10 | 90 | 0.133 | 6.22 | 17.2 |
| 8-3 Inventive | 25 | 75 | 0.136 | 6.30 | 15.9 |
| 8-4 Inventive | 50 | 50 | 0.139 | 6.43 | 13.8 |
| 8-5 Inventive | 75 | 25 | 0.148 | 6.87 | 12.0 |
| 8-6 Comparison | 100 | 0 | 0.114 | 5.29 | 18.8 |

It can be seen from Table 7 that when the first compound was used at a level of 50% or 75%, the inventive devices had lower voltages relative to the comparison devices. In these cases the inventive devices also exhibited higher luminance.

Example 9

Fabrication of Light-Emitting Devices 9-1 through 9-6

EL devices, 9-1 through 9-6, satisfying the requirements of the invention and for the purposes of comparison, were constructed in the following in the same manner as those described in Example 8, except the 35 nm electron-transporting layer (ETL) layer contained a mixture of:

1) A-16 and 2% lithium metal, or
2) B-1 and 2% lithium metal, or
3) A-16, B-1, and 2% lithium metal, the percentages B-1 and A-16 in each device are indicated in indicated in Table 8.

The cells thus formed were tested for luminous efficiency and color at an operating current density of 20 mA/cm² and the results are reported in Table 8 in the form of efficiency (w/A), luminance yield (cd/A), and voltage (V).

TABLE 8

Device performance from Example 9.[1]

| Device | % First Compound (A-16) | % Second Compound (B-1) | Efficiency (W/A) | Luminous Yield (Cd/A) | Voltage (V) |
|---|---|---|---|---|---|
| 9-1 Comparison | 0 | 98 | 0.146 | 6.80 | 12.7 |
| 9-2 Inventive | 9 | 89 | 0.148 | 6.84 | 11.9 |
| 9-3 Inventive | 24 | 74 | 0.149 | 6.88 | 11.3 |
| 9-4 Inventive | 49 | 49 | 0.149 | 6.94 | 11.1 |
| 9-5 Inventive | 74 | 24 | 0.144 | 6.70 | 11.7 |
| 9-6 Comparison | 98 | 0 | 0.134 | 6.23 | 17.6 |

[1]All devices also contain 2% Li in the electron-transporting layer.

It can be seen from Table 8 that the inventive devices had lower voltage relative to the comparison devices.

Example 10

Fabrication of Comparison Devices 10-1 through 10-6

EL devices, 10-1 through 10-6, for the purposes of comparison, were constructed in the following manner. A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

a) Over the ITO was deposited a 1 nm fluorocarbon ($CF_x$) hole-injecting layer (HL) by plasma-assisted deposition of $CHF_3$.

b) A hole-transporting layer (HTL) of N,N-di-1-naphthalenyl-N,N-diphenyl-4,4'-diaminobiphenyl (NPB) having a thickness of 75 nm was then evaporated onto a).

c) A 35 nm light-emitting layer (LEL) of tris(8-quinolinolato)aluminum(III) (Alq) was then deposited onto the hole-transporting layer.

d) A 35 nm electron-transporting layer (ETL) of Alq or lithium quinolate (Liq) or mixtures of the two, as indicated in indicated in Table 9, was then deposited onto the light-emitting layer.

e) On top of the ETL was deposited a 0.5 nm layer of LiF.

f) On top of the LiF layer was deposited a 100 nm layer of Al to form the cathode.

The above sequence completed the deposition of the EL device. The device was then hermetically packaged in a dry glove box for protection.

The cells thus formed were tested for luminous efficiency and color at an operating current density of 20 mA/cm² and the results are reported in Table 9 in the form of efficiency (w/A), luminance yield (cd/A), and voltage (V).

TABLE 9

Device performance from Example 10.

| Device | Percent Liq[1] | Percent B-1 (Alq) | Efficiency (W/A) | Luminous Yield (Cd/A) | Voltage (V) |
|---|---|---|---|---|---|
| 10-1 Comparison | 0 | 100 | 0.024 | 3.23 | 8.29 |
| 10-2 Comparison | 10 | 90 | 0.025 | 3.40 | 8.49 |
| 10-3 Comparison | 25 | 75 | 0.025 | 3.36 | 8.44 |
| 10-4 Comparison | 50 | 50 | 0.023 | 3.18 | 8.92 |
| 10-5 Comparison | 75 | 25 | 0.020 | 2.75 | 10.90 |
| 10-6 Comparison | 100 | 0 | 0.020 | 2.69 | 12.10 |

[1]Liq represents lithium quinolate.

It can be seen from Table 9 that the devices using mixtures of Alq and Liq as the electron-transporting materials did not give a voltage reduction relative to the devices using only Alq.

Example 11

Fabrication of OLED Devices 11-1 through 11-8

EL devices 11-1 through 11-8 were constructed in the following manner.

A glass substrate coated with an 85 nm layer of indium-tin oxide (ITO) as the anode was sequentially ultrasonicated in a commercial detergent, rinsed in deionized water and exposed to oxygen plasma for about 1 min.

a) Over the ITO was deposited a 1 nm fluorocarbon (CF$_x$) hole-injecting layer (HIL) by plasma-assisted deposition of CHF$_3$.

b) A hole-transporting layer (HTL) of N,N'-di-1-naphthalenyl-N,N'-diphenyl-4,4'-diaminobiphenyl (NPB) having a thickness of 65 nm was then evaporated onto a).

c) A 35 nm light-emitting layer (LEL) including 74% bis (2-methyl-8-quinolinolato)(4-phenylphenolato)aluminum (III) (BAlq), 14% NPB and 10% of tris(1-phenylisoquinolinato-N,C$^2$')Iridium(III) (Ir(1-piq)$_3$) was then deposited onto the hole-transporting layer.

d) A 10 nm hole-blocking layer of bis(2-methyl-8-quinolinolato)(4-phenylphenolato)aluminum(III) (BAlq) was then deposited on the light-emitting layer.

e) A 35 nm electron-transporting layer (ETL) including A-16 or B-1 or mixtures of the two, as indicated in Table 10, was then deposited onto the hole-blocking layer.

f) On top of the ETL was deposited a 0.5 nm layer of LiF.

g) On top of the LiF layer was deposited a 100 nm layer of Al to form the cathode.

The above sequence completed the deposition of the EL device. The device was then hermetically packaged in a dry glove box for protection.

In samples 11-4 and 11-8, the HBL of step d) was eliminated.

In samples 11-5 to 11-8, the ETL layer of step e) additionally contained 2% of lithium.

The cells thus formed were tested for luminous efficiency and color at an operating current density of 20 mA/cm$^2$ and the results are reported in Table 10 in the form of efficiency (w/A), luminance yield (cd/A), and voltage (V).

Example 12

Fabrication of OLED Devices 12-1 through 12-4

EL devices, 12-1 through 12-4, for the purposes of comparison, were constructed in the following manner.

A glass substrate coated with an 85 nm layer of indium-tin oxide (ITO) as the anode was sequentially ultrasonicated in a commercial detergent, rinsed in deionized water and exposed to oxygen plasma for about 1 min.

a) Over the ITO was deposited a 1 nm fluorocarbon (CF$_x$) hole-injecting layer (HIL) by plasma-assisted deposition of CHF$_3$.

b) A hole-transporting layer (HTL) of N,N-di-1-naphthalenyl-N,N'-diphenyl-4,4'-diaminobiphenyl (NPB) having a thickness of 75 nm was then evaporated onto a).

c) A 35 nm light-emitting layer (LEL) including 49.5% Alq, 49.5% NPB and 1% of fluorescent dye L30 was then deposited onto the hole-transporting layer.

d) A 35 nm electron-transporting layer (ETL) including A-16 or B-1 or mixtures of the two, as indicated in indicated in Table 11, was then deposited onto the light-emitting layer.

e) On top of the ETL was deposited a 0.5 nm layer of LiF.

f) On top of the LiF layer was deposited a 100 nm layer of Al to form the cathode.

The above sequence completed the deposition of the EL device. The device was then hermetically packaged in a dry glove box for protection.

The cells thus formed were tested for luminous efficiency and color at an operating current density of 20 mA/cm$^2$ and the results are reported in Table 11 in the form of efficiency (w/A), luminance yield (cd/A), and voltage (V).

TABLE 10

Device performance from Example 11.

| Device | % First Compound (A-16) | % Second Compound (B-1) | HBL | Efficiency (W/A) | Luminous Yield (Cd/A) | Voltage (V) |
|---|---|---|---|---|---|---|
| 11-1 Comparison | 0 | 100 | Present | 0.038 | 1.62 | 11.7 |
| 11-2 Comparison | 100 | 0 | Present | 0.032 | 1.36 | 10.4 |
| 11-3 Inventive | 50 | 50 | Present | 0.036 | 1.62 | 8.6 |
| 11-4 Comparison | 50 | 50 | None | 0.013 | 1.23 | 7.3 |
| 11-5 Comparison | 0 | 98 | Present | 0.039 | 1.64 | 8.7 |
| 11-6 Comparison | 98 | 0 | Present | 0.037 | 1.54 | 10.9 |
| 11-7 Inventive | 49 | 49 | Present | 0.037 | 1.57 | 7.7 |
| 11-8 Comparison | 49 | 49 | None | 0.010 | 0.41 | 6.9 |

The results shown in Table 10 demonstrate that the hole-blocking layer is required for both low voltage and high efficiency, compare samples 11-3 vs 11-4 and 11-7 vs 11-8. Comparison of inventive sample 11-3 to comparative samples 11-1 and 11-2 (no metal in the further layer) or inventive sample 11-7 to comparative samples 11-5 and 11-6 (with lithium in the further layer) shows lower voltages and equivalent efficiency with the mixed layer compared to either component alone. Comparative sample 11-4, which lacks a hole-blocking layer, has lower voltage than inventive sample 11-3 (which is expected since the entire device is thinner without the hole-blocking layer) but the efficiency is poor. The same is true for comparative sample 11-8 (with lithium) relative to inventive sample 11-7.

TABLE 11

Device performance from Example 12.

| Device | % First Compound (A-16) | % Second Compound (B-1) | Efficiency (W/A) | Luminous Yield (Cd/A) | Voltage (V) |
|---|---|---|---|---|---|
| 12-1 Comparison | 0 | 100 | 0.057 | 8.98 | 6.83 |
| 12-2 Comparison | 50 | 50 | 0.033 | 4.66 | 6.23 |

TABLE 11-continued

Device performance from Example 12.

| Device | % First Compound (A-16) | % Second Compound (B-1) | Efficiency (W/A) | Luminous Yield (Cd/A) | Voltage (V) |
|---|---|---|---|---|---|
| 12-3 Comparison | 75 | 25 | 0.037 | 5.46 | 5.77 |
| 12-4 Comparison | 100 | 0 | 0.023 | 3.44 | 8.22 |

All of the devices in Example 12 are comparative since the LEL contains a fluorescent light-emitting compound and do not have a hole-blocking layer. For sample 12-3 (75/25 A-16/B-1 mixed ETL), the improvement in voltage relative to sample 12-4 (all A-16) is 30% and relative to sample 12-1 (all B-1) is 15%. For sample 12-2 (50/50 A-16/B-1 mixed ETL), the improvement in voltage relative to sample 12-4 (all A-16) is 24% and relative to sample 12-1 (all B-1) is 9%. These results can be compared to the results for devices with a phosphorescent LEL and the same mixed ETL and comparisons as shown in Example 6, devices 6-1, 6-4 6-5 and 6-6. For sample 64 (75/25 A-16/B-1 mixed ETL), the improvement in voltage relative to sample 6-6 (all A-16) is 34% and relative to sample 6-1 (all B-1) is 11%. For sample 6-4 (50/50 A-16/B-1 mixed ETL), the improvement in voltage relative to sample 6-6 (all A-16) is 30% and relative to sample 6-1 (all B-1) is 4%. These results show that the improvements in voltage seen with a mixed ETL with a phosphorescent LEL on average are larger than improvements with the same mixed ETL with a fluorescent LEL.

Example 13

Fabrication of OLED Devices 13-1 through 13-8

EL devices 13-1 through 13-8 were constructed in the following manner.

A glass substrate coated with an 85 nm layer of indium-tin oxide (ITO) as the anode was sequentially ultrasonicated in a commercial detergent, rinsed in deionized water and exposed to oxygen plasma for about 1 min.

a) Over the ITO was deposited a 1 nm fluorocarbon ($CF_x$) hole-injecting layer (HIL) by plasma-assisted deposition of $CHF_3$.

b) A hole-transporting layer (HTL) of N'-di-1-naphthalenyl-N,N'-diphenyl-4,4'-diaminobiphenyl (NPB) having a thickness of 115 nm was then evaporated onto a).

c) A 35 nm light-emitting layer (LEL) including 83% bis (2-methyl-8-quinolinolato)(4-phenylphenolato)aluminum (III) (BAlq), 15% NPB and 2% of tris(1-phenylisoquinolinato-N,$C^{2'}$)Iridium(III) ($Ir(1-piq)_3$) was then deposited onto the hole-transporting layer.

d) A 10 nm hole-blocking layer of bis(2-methyl-8-quinolinolato)(4-phenylphenolato)aluminum(III) (BAlq) was then deposited on the light-emitting layer.

e) A 35 nm electron-transporting layer (ETL) including compounds as indicated in Table 12, was then deposited onto the hole-blocking layer.

f) On top of the ETL was deposited a 0.5 nm layer of LiF.

g) On top of the LiF layer was deposited a 100 nm layer of Al to form the cathode.

The above sequence completed the deposition of the EL device. The device was then hermetically packaged in a dry glove box for protection.

The cells thus formed were tested for luminous efficiency and color at an operating current density of 20 mA/cm² and the results are reported in Table 12 in the form of efficiency (w/A), luminance yield (cd/A), and voltage (V).

TABLE 12

Device performance from Example 13.

| Device | % First Compound | % Second Compound | Efficiency (W/A) | Luminous Yield (Cd/A) | Voltage (V) |
|---|---|---|---|---|---|
| 13-1 Comparison | none | 100 B-1 | 0.179 | 10.2 | 7.96 |
| 13-2 Comparison | none | 100 An-1[1] | 0.092 | 5.22 | 14.6 |
| 13-3 Comparison | 100 A-16 | none | 0.148 | 8.38 | 13.4 |
| 13-4 Comparison | 75 A-16 | 25 An-1 | 0.150 | 8.54 | 12.9 |
| 13-5 Comparison | 50 A-16 | 50 An-1 | 0.144 | 8.19 | 12.9 |
| 13-6 Comparison | 25 A-16 | 75 An-1 | 0.130 | 7.40 | 13.4 |
| 13-7 Invention | 50 A-16 | 50 B-5 | 0.158 | 9.00 | 7.57 |
| 13-8 Invention | 75 A-16 | 25 B-5 | 0.180 | 10.2 | 7.23 |

[1] An-1 is 9-(1-naphthyl), 10-(2-naphthyl)anthracene.

Example 14 (devices 14-1 to 14-8) was prepared and tested as Example 13 except that the phosphorescent LEL of step c) was replaced with a different phosphorescent layer consisting of 94% CBP and 6% $Ir(ppy)_3$. Results are shown in Table 13.

TABLE 13

Device performance from Example 14.

| Device | % First Compound | % Second Compound | Efficiency (W/A) | Luminous Yield (Cd/A) | Voltage (V) |
|---|---|---|---|---|---|
| 14-1 Comparison | none | 100 B-1 | 0.193 | 29.5 | 10.1 |
| 14-2 Comparison | none | 100 An-1[1] | 0.114 | 17.4 | 15.8 |
| 14-3 Comparison | 100 A-16 | none | 0.157 | 23.8 | 13.9 |
| 14-4 Comparison | 75 A-16 | 25 An-1 | 0.163 | 24.7 | 13.9 |
| 14-5 Comparison | 50 A-16 | 50 An-1 | 0.157 | 24.0 | 14.1 |
| 14-6 Comparison | 25 A-16 | 75 An-1 | 0.142 | 21.7 | 14.9 |
| 14-7 Invention | 50 A-16 | 50 B-5 | 0.189 | 28.8 | 9.20 |
| 14-8 Invention | 75 A-16 | 25 B-5 | 0.192 | 29.3 | 8.53 |

[1] An-1 is 9-(1-naphthyl), 10-(2-naphthyl)anthracene.

The results of devices 13-7, 13-8, 14-7 and 14-8 in Tables 12 and 13 clearly show that devices with a phosphorescent LEL that use a mixed ETL composed of a tetracene of formula V and a low voltage ETM with a higher LUMO than the tetracene give unexpected improvements in efficiency and voltage. Devices with an ETL composed of a mixture of a tetracene and a compound that is not a low voltage ETM as shown in devices 13-4 to 13-6 and 14-4 to 14-6 do not show any improvement in voltage. As an anthracene, An-1 is analogous to A-10 in Table 2 and should not meet the requirements of a low voltage ETM.

The invention has been described in detail with particular reference to certain preferred embodiments thereof, but it will be understood that variations and modifications can be effected within the spirit and scope of the invention. For example, multiple second compounds can be used in said further layer of the invention as long as they have the correct LUMO values. In addition, the invention can be used in devices emitting any colored light and said layer can be adjacent to other layers on either side, between the cathode and the LEL.

The patents and other publications referred to are incorporated herein in their entirety.

PARTS LIST

100 OLED
110 Substrate
120 Anode
130 Hole-Injecting layer (HIL)
132 Hole-Transporting layer (HTL)
134 Light-Emitting layer (LEL)
135 Hole-Blocking Layer (HBL)
136 Electron-Transporting layer (ETL)
138 Electron-Injecting layer (EIL)
140 Cathode
150 Voltage/Current Source
160 Electrical Connectors

The invention claimed is:

1. An OLED device comprising, in sequence, an anode, a light-emitting layer that comprises a phosphorescent light-emitting organometallic compound, a hole-blocking layer, and a cathode, and between the hole-blocking layer and the cathode, non-emitting electron transporting layer containing:
   a) a first compound that has a LUMO value of −2.7 eV or lower, in an amount greater than or equal to 40% by volume and less than 90% by volume of the layer wherein the first compound is a compound represented by Formula V:

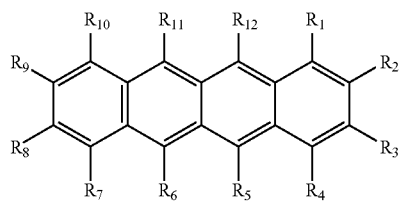

Formula V wherein:
   $R_1$, $R_3$, $R_4$, $R_7$, $R_9$, and $R_{10}$ are hydrogen;
   $R_2$ and $R_8$ represent hydrogen or independently selected alkyl groups,
   $R_6$ and $R_{11}$ represent hydrogen or independently selected aryl groups, and
   $R_5$ and $R_{12}$ represent aryl groups;
and
   b) at least one second compound that is a low voltage electron transport material, exhibiting a higher LUMO value than the first compound, the total amount of said compound(s) being less than or equal to 40% by volume and more than 10% by volume of the layer, wherein the second compound is represented by either Formula I:

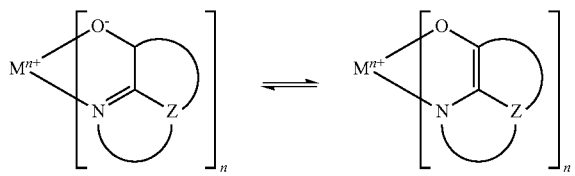

Formula I wherein
   M represents a metal;
   n is an integer of from 1 to 4; and
   Z independently in each occurrence represents the atoms completing a nucleus having at least two fused aromatic rings; or Formula VII:

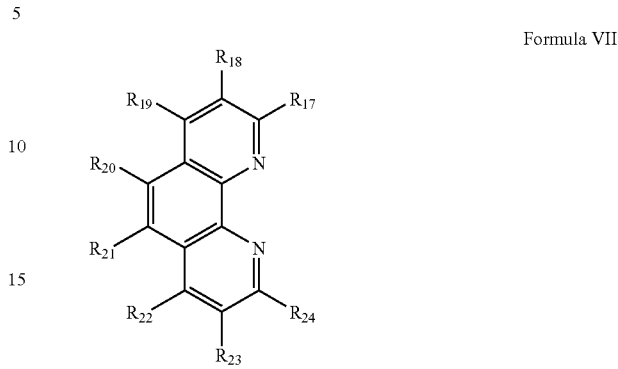

Formula VII wherein
   $R_{17}$, $R_{18}$, $R_{19}$, $R_{20}$, $R_{21}$, $R_{22}$, $R_{23}$ and $R_{24}$ are hydrogen or substituents; and provided that any of the indicated substituents may join to form further fused rings.

2. The OLED device of claim 1 wherein said electron transporting layer is adjacent to an electron-injecting layer, which is adjacent to the cathode.

3. The OLED device of claim 1 wherein said electron transporting layer is adjacent to the cathode.

4. The OLED device of claim 1 comprising a first compound and two second compounds.

5. The OLED device of claim 1 wherein the first compound is present in an amount of 50% to 80% by volume.

6. The OLED device of claim 1 wherein $R_6$ and $R_{11}$ represent independently selected aryl groups in the compound of Formula V.

7. The OLED device of claim 1 wherein the second compound is tris(8-quinolinolato)aluminum (III)(Alq).

8. The OLED device of claim 1 wherein the phosphorescent light-emitting material comprises an organometallic complex comprising a metal and at least one ligand, wherein the metal is selected from the group consisting of Ir, Rh, Ru, Pt, and Pd.

9. The device of claim 8 wherein the metal is Ir.

10. The device of claim 8 wherein at least one ligand comprises a 2-phenylpyridine group, a 1-phenylisoquinoline group, a 3-phenylisoquinoline group, a 1-phenylimidazo[1,2-a]pyridine, a thiazole ring group that is fused with at least one aromatic ring group, or an oxazole ring group that is fused with at least one aromatic ring group.

11. The device of claim 1 wherein the hole-blocking layer comprises bathocuproine (BCP) or bis(2-methyl-8-quinolinolato)(4-phenylphenolato)Aluminum(III) (Balq).

12. The OLED device of claim 1 wherein the electron transporting layer contains a metal having a work function less than 4.2 eV.

13. The device of claim 12 wherein the metal is Li metal.

14. The device of claim 12 wherein the metal is present at a level of 1 to 5% of the layer.

15. The device of claim 1 wherein the first compound is selected from the group consisting of:
16. The device of claim 1 wherein the second compound is selected from the group consisting of:
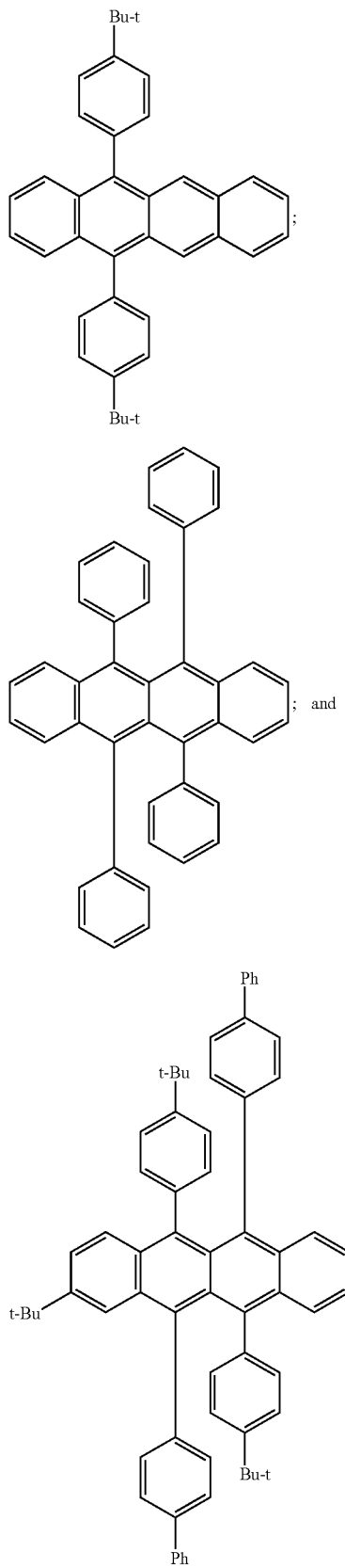

17. The device of claim 1 wherein the first compound is selected from the group consisting of:
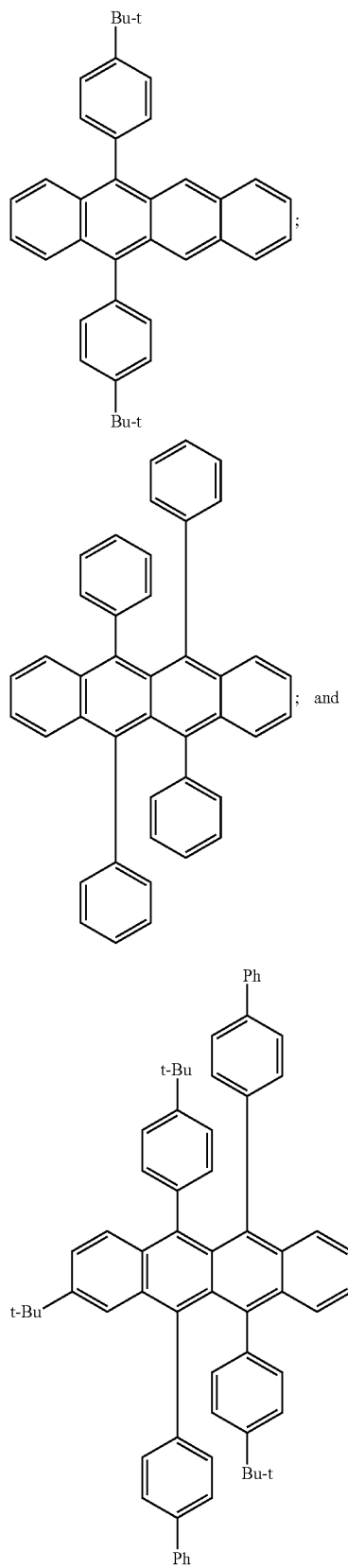
A-13
A-14
A-16
and the second compound is selected from the group consisting of:
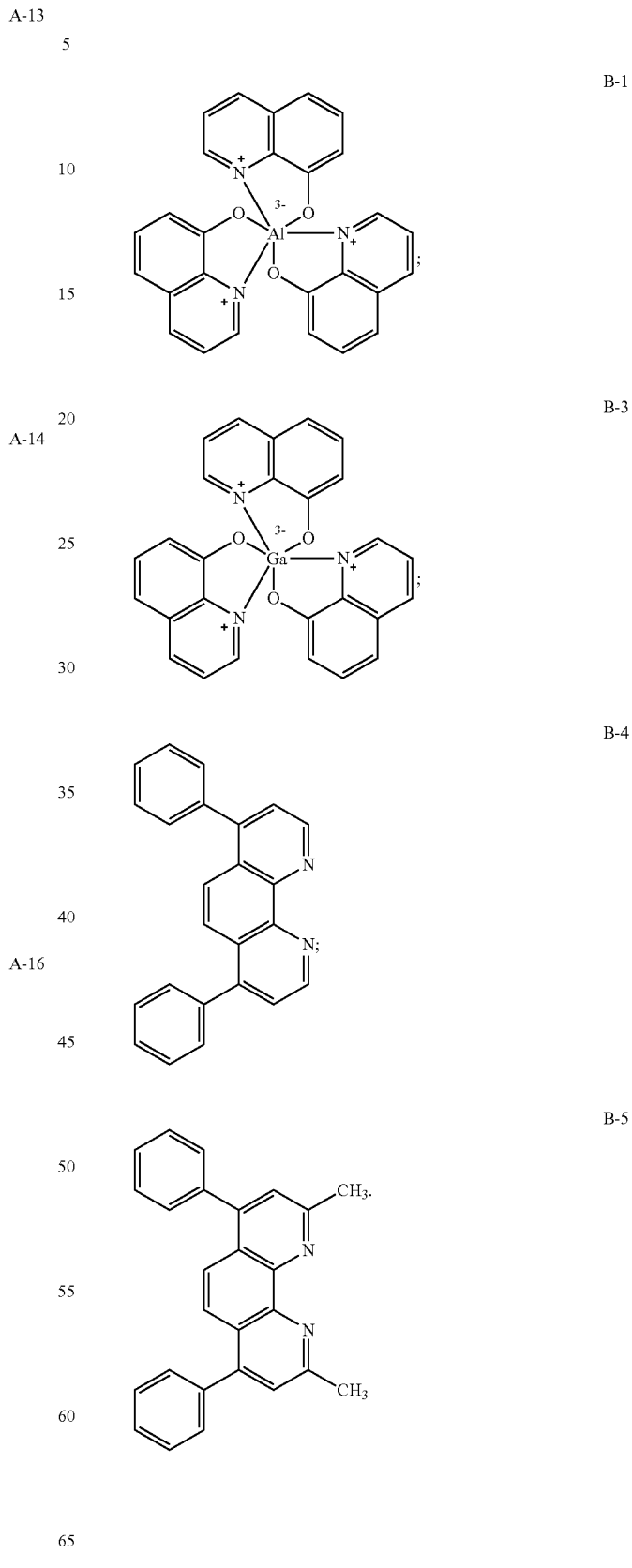
B-1
B-3
B-4
B-5
* * * * *